(12) United States Patent  (10) Patent No.: US 6,924,868 B2
Higuchi et al.  (45) Date of Patent: Aug. 2, 2005

(54) LIQUID CRYSTAL DISPLAY DEVICE, METHOD FOR FABRICATING THE SAME, AND PORTABLE TELEPHONE USING THE SAME

(75) Inventors: Kazuhisa Higuchi, Tachikawa (JP); Yoshikazu Yokota, Kodaira (JP); Kimihiko Sugiyama, Matsudo (JP)

(73) Assignees: Renesas Technology Corp., Tokyo (JP); Hitachi Device Engineering Co., Ltd., Chiba (JP)

( * ) Notice: Subject to any disclaimer, the term of this patent is extended or adjusted under 35 U.S.C. 154(b) by 4 days.

(21) Appl. No.: 09/983,142

(22) Filed: Oct. 23, 2001

(65) Prior Publication Data

US 2002/0021399 A1 Feb. 21, 2002

Related U.S. Application Data

(63) Continuation of application No. 09/269,022, filed on Jul. 26, 1999, now Pat. No. 6,323,930.

(30) Foreign Application Priority Data

Sep. 20, 1996 (WO) .............................. PCT/JP96/02728

(51) Int. Cl.$^7$ ...................... G02F 1/1345; H01L 23/58; H01L 23/48
(52) U.S. Cl. ...................... 349/151; 257/634; 257/737; 257/738; 257/774; 257/779; 257/782
(58) Field of Search .......................... 349/151; 257/634, 257/737, 738, 774, 779, 782

(56) References Cited

U.S. PATENT DOCUMENTS 5,737,053 A   4/1998  Yomogihara et al.
5,777,610 A   7/1998  Sugimoto et al.
5,945,984 A   8/1999  Kuwashiro
6,147,739 A * 11/2000  Shibatani .................... 349/152

FOREIGN PATENT DOCUMENTS

JP   63-191130   8/1988
JP   4-281431    10/1992
JP   6-118433    4/1994

* cited by examiner

Primary Examiner—Toan Ton
Assistant Examiner—Hoan C. Nguyen
(74) Attorney, Agent, or Firm—Mattingly, Stanger, Malur & Brundidge, P.C.

(57) ABSTRACT

A liquid crystal display device comprises a liquid crystal display panel and a semiconductor integrated circuit for driving and controlling the liquid crystal display panel. The number of input/output wires connected to I/O terminals (bonding pads) of the semiconductor integrated circuit is reduced so as to simplify wiring patterns of the I/O wires, whereby degrees of freedom in arranging the I/O wiring patterns are enhanced. The panel has a pair of insulating substrate, and the semiconductor integrated circuit is mounted on one of the paired substrates. The semiconductor integrated circuit has a mode terminal which is fixed to a power supply potential or to a reference potential during operation of the integrated circuit, and power supply dummy terminals connected to the power supply potential or reference potential inside the semiconductor integrated circuit. The wiring patterns formed on the paired insulating substrates connect the mode terminal to the power supply dummy terminals.

7 Claims, 24 Drawing Sheets

F I G. 2
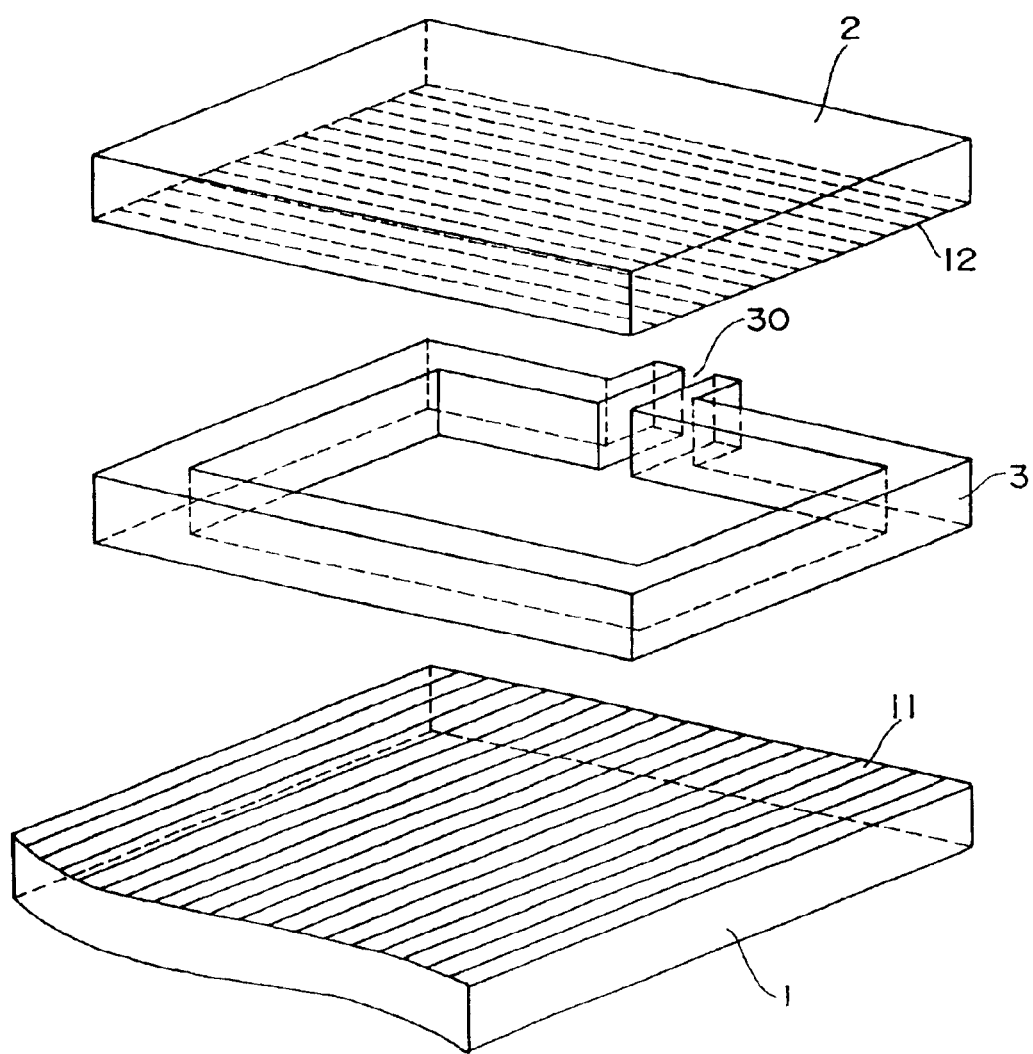

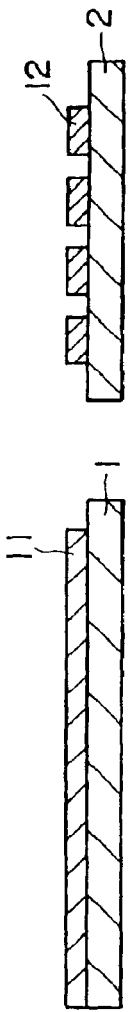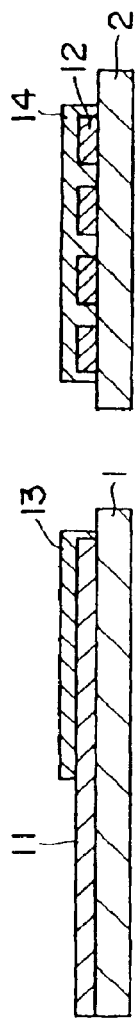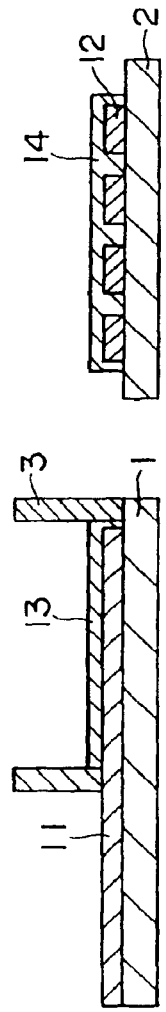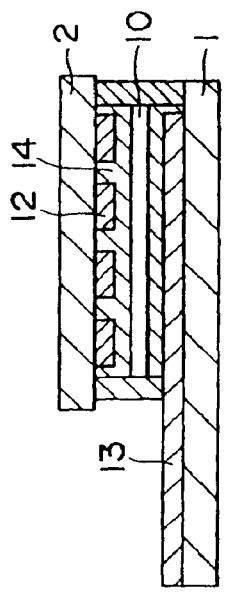
FIG. 8(a)
FIG. 8(b)
FIG. 8(c)
FIG. 8(d)
FIG. 8(e)

| FIG. 16A |
|---|
| FIG. 16B |

| FIG. 18A |
|---|
| FIG. 18B |

LIQUID CRYSTAL DISPLAY DEVICE, METHOD FOR FABRICATING THE SAME, AND PORTABLE TELEPHONE USING THE SAME

This is a continuation application of U.S. Ser. No. 09/269,022, filed Jul. 26, 1999 now U.S. Pat. No. 6,323,930.

TECHNICAL FIELD

The present invention relates to a liquid crystal display device and, more particularly to a liquid crystal display device with a reduced number of input/output wires connected to input/output terminals of a semiconductor integrated circuit for controlling and driving a liquid crystal display panel.

BACKGROUND ART

Liquid crystal display (LCD) devices are characterized in that they are fabricated in a very thin form, are driven on a low voltage and consume only small quantities of power. Blessed with such features, a large number of LCD devices have been used extensively in various electronic apparatuses. Of these display devices, those particularly small in size have been adapted for use on electronic calculators and digital watches. In recent years, such small display devices are also finding their way into portable telephones.

For use on portable telephones, small-sized LCD devices are generally simple matrix LCD devices operating in one of two modes: twisted nematic (TN) mode, or super twisted nematic (STN) mode.

A simple matrix LCD device of a known type used on the portable telephone is an LCD module composed of an LCD panel and an LCD controller made of a single semiconductor integrated circuit to control the panel, the components being connected by a chip-on-glass (COG) arrangement.

More specifically, the chip-on-glass type LCD module has an LCD panel with liquid crystal interposed and sealed between a pair of glass substrates. On one of the two glass substrates constituting the LCD panel is an LCD controller (LSI) made of a single semiconductor integrated circuit.

The LCD controller-mounted glass substrate is formed integrally with liquid crystal output wires and input/output wires. The liquid crystal output wires are connected to liquid crystal output terminals of the LCD controller so that the controller may output liquid crystal driving voltages (segment and common voltages) to electrodes (segment and common electrodes) inside the LCD panel. The input/output wires are connected to input/output terminals of the LCD controller so that various signals are input to and output from the controller. The input/output wires are drawn to an edge of the controller-mounted glass substrate and connected there to a printed circuit board that comprises a central processing unit (CPU) and other components.

As outlined above, the chip-on-glass type LCD module has an LCD panel, an LCD controller (LSI), liquid crystal output wires and input/output wires, all mounted on a single glass substrate. This constitution contributes to making external dimensions of the LCD module smaller than before. This type of LCD module is discussed illustratively in Japanese Unexamined Patent Publication Nos. Hei 6-118433 and Sho 63-191130.

In the chip-on-glass type LCD module, the liquid crystal output wires formed on one of the paired glass substrates are connected directly to the LCD panel. The direct connection eliminates problems associated with the routing of the liquid crystal output wires.

In general, the input/output wires formed on one of the glass substrates are drawn out of the input/output terminals of the LCD controller (LSI) up to an edge of the glass substrate without being crossed halfway. If the arrangement of the input/output terminals of the LCD controller differs from the arrangement of the input/output terminals of the printed circuit board, then it becomes necessary to cross illustratively signal conductors and power supply wires. The signal conductors supply various signals to the LCD controller and receive output signals from the controller, and the power supply wires carry a supply voltage ($V_{CC}$) or a reference potential ($G_{ND}$). The crossing of the wires and conductors, if carried out, necessitates complicated rerouting of the wiring inside the printed circuit board.

In this connection, an LCD controller (LSI) with mode terminals for changing its internal status (operation mode or device ID information) has a distinctive wiring characteristic. That is, all input/output wires including those connected to the mode terminals are drawn out, without crossing, to an edge of one of the glass substrates. The mode terminals are connected through the printed circuit board to its power supply wires carrying the supply voltage ($V_{CC}$) or reference potential ($G_{ND}$) for the board in question, whereby the mode terminals are continuously pulled up to the supply voltage ($V_{CC}$) or pulled down to the reference potential ($G_{ND}$).

In the above setup, it is necessary to install a large number of input/output wires on one of the glass substrates of the LCD module incorporating the LCD controller (LSI) having the mode terminals. The need to install the numerous wires complicates wiring patterns of the input/output wires and lowers degrees of freedom in arranging the wiring patterns. The interposed presence of the printed circuit board in such wiring further confounds rerouting arrangements.

It is therefore an object of the present invention to provide a liquid crystal display device and a method for fabricating the device, whereby the number of input/output wires connected to input/output terminals of a semiconductor integrated circuit is reduced so that patterns of input/output wiring are simplified and that degrees of freedom in arranging the input/output wiring patterns are enhanced.

It is another object of the present invention to provide a liquid crystal display device and a method for fabricating the device, whereby the number of input/output wires connected to input/output terminals of a semiconductor integrated circuit in the device is reduced so that the device as a whole has reduced external dimensions and that the cost of fabricating the device is lowered.

It is a further object of the present invention to provide a portable telephone such that its external dimensions are reduced and that the cost of fabricating the telephone is lowered through the use of an inventive liquid crystal display device.

Further objects and advantages of this invention will become apparent from a consideration of the accompanying drawings and ensuring description of it.

DISCLOSURE OF THE INVENTION

A summary of typical ones of the invention disclosed in the present application will be described in brief in the following manner.

According to the invention, there is provided a liquid crystal display device comprising a liquid crystal display panel and a semiconductor integrated circuit for controlling and driving the liquid crystal display panel, the semiconductor integrated circuit further having a mode terminal fixed to either a power supply potential or a reference potential during operation of the semiconductor integrated circuit, wherein the semiconductor integrated circuit includes power supply dummy terminals connected at its inside to either the power supply potential or the reference potential, and the mode terminal is connected to the power supply dummy terminals.

The inventive device may further comprise a plurality of mode terminals, wherein the plurality of mode terminals and the power supply dummy terminals may be disposed alternately.

The liquid crystal display panel may have a pair of insulating substrates, and one of the pair of insulating substrates may be mounted with the semiconductor integrated circuit and have wiring patterns formed so as to connect the mode terminal to the power supply dummy terminals.

The semiconductor integrated circuit may comprise a plurality of dummy terminals interconnected by a wiring layer inside the semiconductor integrated circuit.

According to the invention, there is provided a method for fabricating a liquid crystal display device including a liquid crystal display panel and a semiconductor integrated circuit, the liquid crystal display panel having a pair of insulating substrates, the semiconductor integrated circuit being mounted on one of the insulating substrates to drive the liquid crystal display panel, the semiconductor integrated circuit further comprising a mode terminal and power supply dummy terminals, the mode terminal being fixed to either a power supply potential or a reference potential during operation of an integrated circuit, the power supply dummy terminals being connected to either the power supply potential or the reference potential inside the semiconductor integrated circuit, the mode terminal being connected to the power supply dummy terminals, the method comprising the steps of: forming wiring patterns on the pair of insulating substrates; injecting and sealing liquid crystal between the pair of insulating substrates; and bonding the semiconductor integrated circuit to one of the pair of insulating substrates so that the wiring patterns formed on the pair of insulating substrates will connect the mode terminal to the power supply dummy terminals.

According to the invention, there is provided a portable telephone comprising a liquid crystal display device according to the invention.

In the inventive liquid crystal display device, the semiconductor integrated circuit includes mode terminals that are fixed to the power supply potential or reference potential during operation. Inside the semiconductor integrated circuit, the mode terminals are connected to power supply dummy terminals which in turn are connected to the power supply potential or reference potential. This connective arrangement reduces the number of input/output wires connected to input/output terminals of the semiconductor integrated circuit, whereby external dimensions of the liquid crystal display device are reduced and its manufacturing cost is lowered.

The inventive liquid crystal display device may have a plurality of mode terminals and the power supply dummy terminals disposed alternately. This layout permits simplified connection between the mode terminals and power supply dummy terminals.

The wiring patterns formed on the insulating substrates may be arranged to connect the mode terminals to the power supply dummy terminals. The arrangement reduces the number of input/output wires connected to input/output terminals of the semiconductor integrated circuit, whereby the input/output wiring patterns on the insulating substrates are simplified and degrees of freedom in arranging the input/output wiring patterns are enhanced.

In the inventive liquid-crystal display device, the semiconductor integrated circuit may include a plurality of dummy terminals interconnected by a wiring layer inside the integrated circuit. The dummy terminals permit crossing of input/output wires connected to the input/output terminals of the semiconductor integrated circuit.

Furthermore, the inventive liquid crystal display device may be used as displaying means of a portable telephone. The use of such a display device allows the portable telephone to be reduced in external dimensions and fabricated at lower cost than before.

BRIEF DESCRIPTION OF THE DRAWINGS

FIG. 2 is a perspective view of a liquid crystal display panel (LCD) in the module of FIG. 1;

FIG. 8 shows partial cross-sectional views depicting steps for fabricating the liquid crystal display module (LCM) embodying the invention;

BEST MODE FOR CARRYING OUT THE INVENTION

Figure 1:
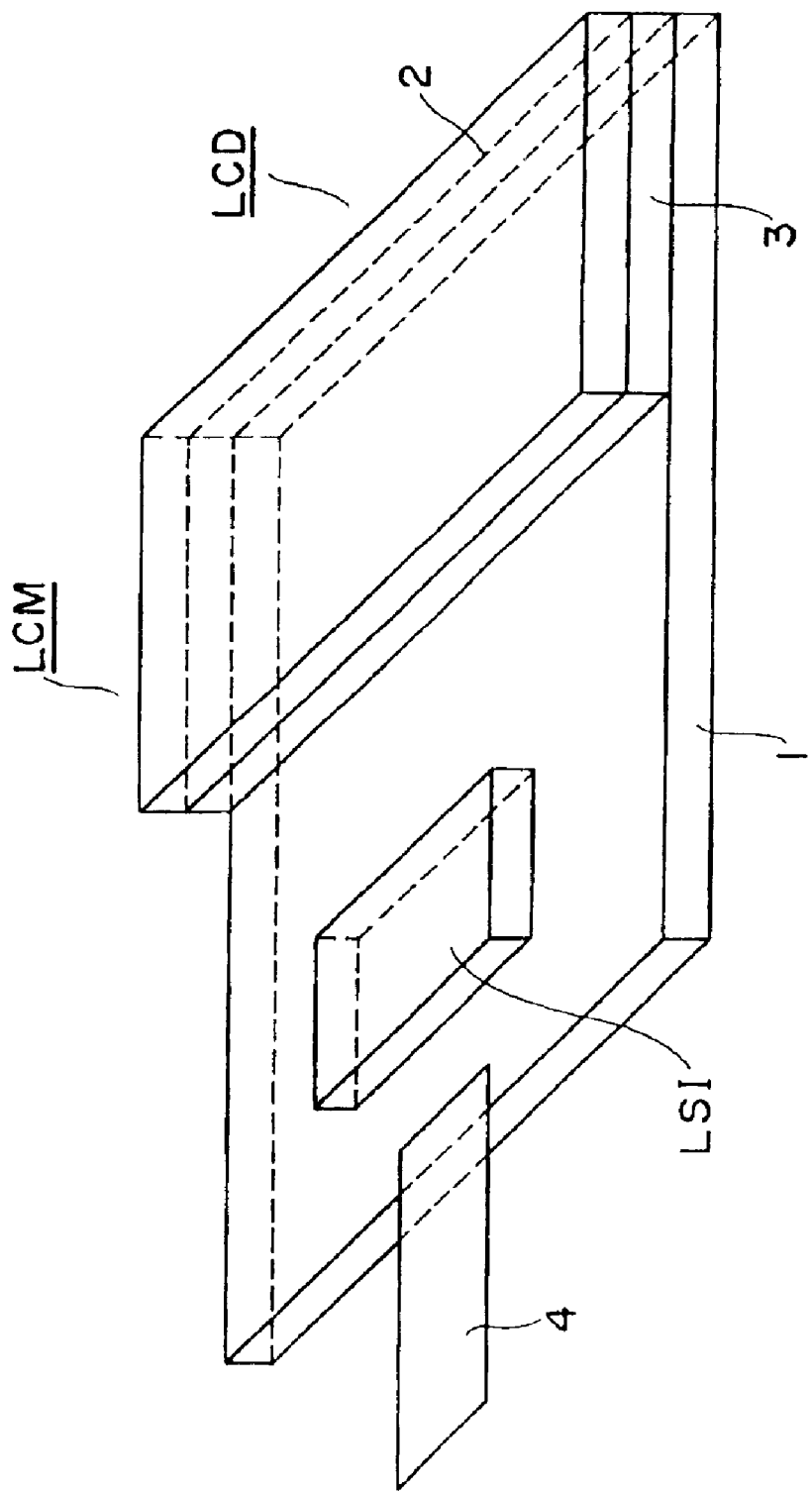
FIG. 1 is a block diagram of a chip-on-glass type liquid crystal display module (LCM) embodying the invention.

Preferred embodiments of this invention will now be described with reference to the accompanying drawings.

Throughout the drawings, like reference characters designate like or corresponding parts, and their descriptions are omitted where they are repetitive.

FIG. 1 is a block diagram of a chip-on-glass type liquid crystal display module (LCM) embodying the invention. As illustrated, the liquid crystal display module includes a liquid crystal display panel (LCD). The panel has a liquid crystal layer injected and sealed between a pair of glass substrates 1 and 2 bonded together, with a sealing material 3 interposed therebetween.

An LCD controller (LSI) composed of a single large-scale semiconductor integrated circuit is mounted on the glass substrate 1. Also mounted on the glass substrate 1 are liquid crystal output wires and input/output wires. The liquid crystal output wires are connected to liquid crystal output terminals of the LCD controller (LSI) so that the controller may output liquid crystal driving voltages (segment voltage and common voltage) to electrodes (segment electrodes and common electrodes) inside the LCD panel. The input/output wires are connected to input/output terminals of the LCD controller (LSI) so as to input and output various signals to and from the controller. The liquid crystal output wiring and input/output wiring are formed by a transparent conductive film (indium-tin-oxide or ITO).

The input/output wires are drawn out to an edge of the glass substrate 1 and connected there to a heat seal (printed circuit board) 4, whereby the wires are connected to the printed circuit board carrying a central processing unit (CPU) and other components.

The LCD controller mounted on the glass substrate 1 is bonded face down to the transparent conductive film (ITO comprising input/output and liquid crystal output wires) on the glass substrate 1. Gold bumps deposited on pads of the LCD controller connect the latter to the transparent conductive film.

Figure 3:
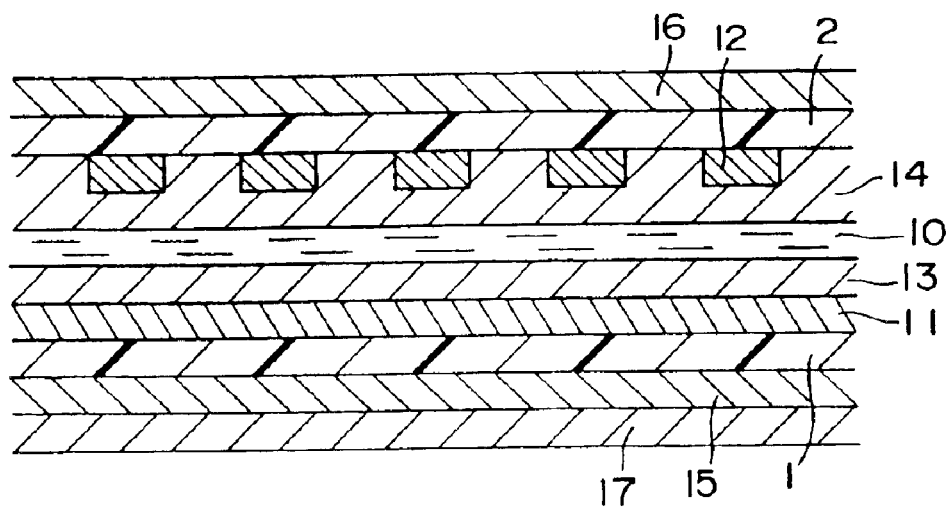
FIG. 3 is a partial cross-sectional view outlining a constitution of the LCD panel in FIG. 1.

FIG. 2 is a perspective view of a typical liquid crystal display panel (LCD) in the module of FIG. 1, and FIG. 3 is a partial cross-sectional view outlining a typical constitution of the LCD panel in FIG. 1.

The LCD panel shown in FIGS. 2 and 3 is an STN type LCD panel. As illustrated, the LCD panel has a plurality of segment electrodes 11 made of a striped transparent conductive film (ITO) on the side of the glass substrate 1, and a plurality of common electrodes 12 also formed by a striped transparent conductive film (ITO) on the side of the glass substrate 2, the two groups of electrodes being separated by a liquid crystal layer 10. The plurality of segment electrodes 11 and an oriented layer 13 are stacked inside the glass substrate 1 (on liquid crystal layer side), and the plurality of common electrodes 12 and another oriented layer 14 are stacked inside the glass substrate 2 (also on liquid crystal layer side). A deflection plate 15 and a phase difference plate 17 are formed outside the glass substrate 1, and another deflection plate 16 is provided outside the glass substrate 2.

The segment electrodes 11 and common electrodes 12 are at right angles to one another. Intersections between the segment electrodes 11 and the common electrodes 12 constitute pixel regions.

It is possible to provide spacers within the liquid crystal layer 10 to keep the latter's gap length constant. The LCD panel shown in FIGS. 2 and 3 is equipped with a backlight arrangement under the glass substrate 1. The backlight illuminates the LCD panel from behind.

Figure 4:
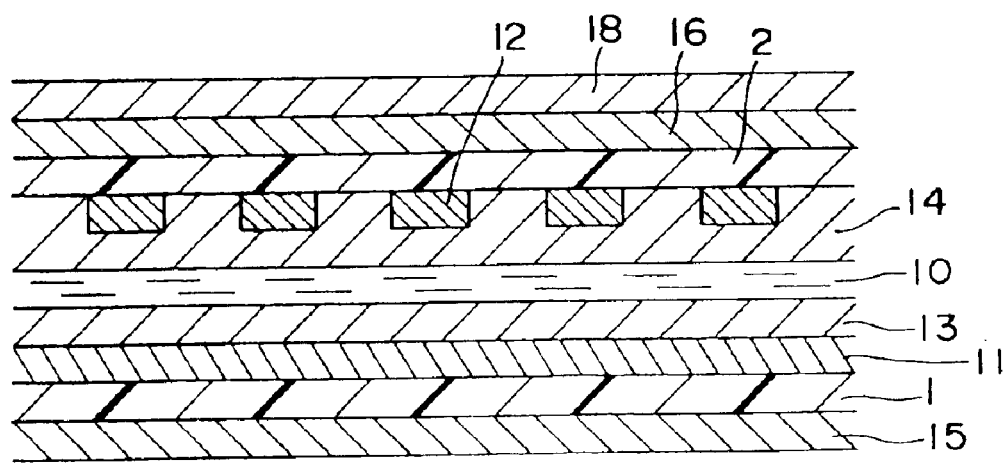
FIG. 4 is a partial cross-sectional view outlining another constitution of the LCD panel in FIG. 1.

FIG. 4 is a partial cross-sectional view outlining another constitution of the LCD panel in FIG. 1. The LCD panel in FIG. 4 is a reflective TN type liquid crystal display panel. An internal structure of the LCD panel shown in FIG. 4 is basically the same as that of the LCD panel in FIG. 3. The difference is that the LCD panel in FIG. 4 has the deflection plate 15 furnished outside the glass substrate 1 and has the deflection plate 16 and a reflection plate 18 provided outside the glass plate 2.

Figure 5:
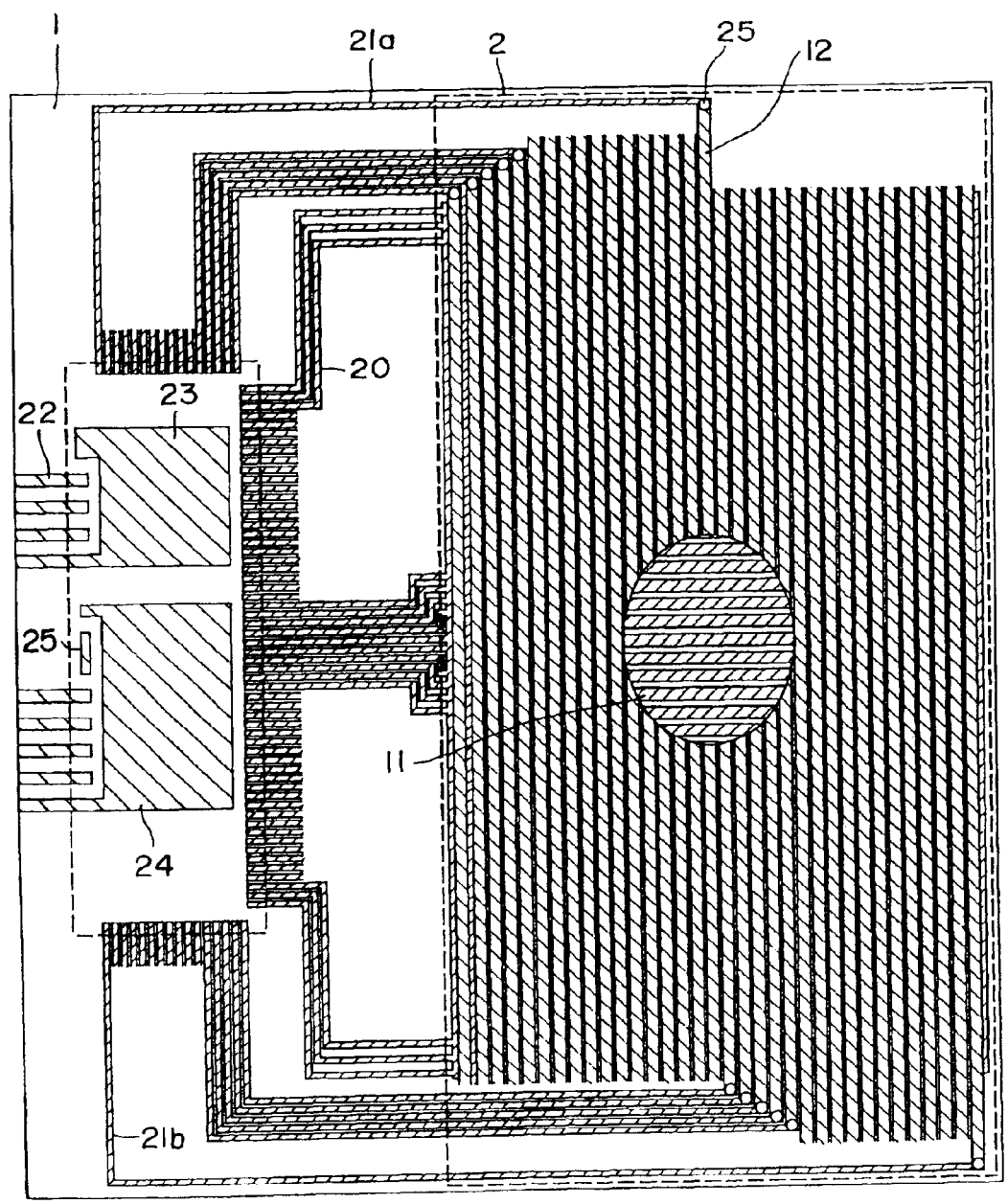
FIG. 5 is a plan view of wiring patterns of a transparent conductive film (ITO) on a glass substrate 1 in association with segment electrodes 11 and common electrodes 12.

FIG. 5 is a plan view of wiring patterns of the transparent conductive film (ITO) on the glass substrate 1. The patterns are shown in association with the segment electrodes 11 and common electrodes 12.

In FIG. 5, the LCD controller (LSI) is bonded face down to a portion enclosed by broken lines. Gold bumps deposited on pads of the LCD controller connect the latter to the transparent conductive film (ITO). The liquid crystal output wires feeding the segment voltage to the segment electrodes 11 and the common voltage to the common electrodes 12 in the LCD panel are divided into two groups: output wires 20 on the segment side, and output wires 21 on the common side.

Most of the segment-side liquid crystal output wires 20 are formed integrally and continuously with the segment electrodes 11 in the LCD panel. Those portions of the segment-side liquid crystal output wires 20 which are located inside the LCD panel constitute the segment electrodes 11. The common-side liquid crystal output wires 21 are subdivided into upper common-side liquid crystal output wires 21a and lower common-side liquid crystal output wires 21b. Part of the segment-side liquid crystal output wires 20 and the common-side liquid crystal output wires (21a and 21b) are connected to the common electrodes 12 via connecting regions 25.

Figure 6:
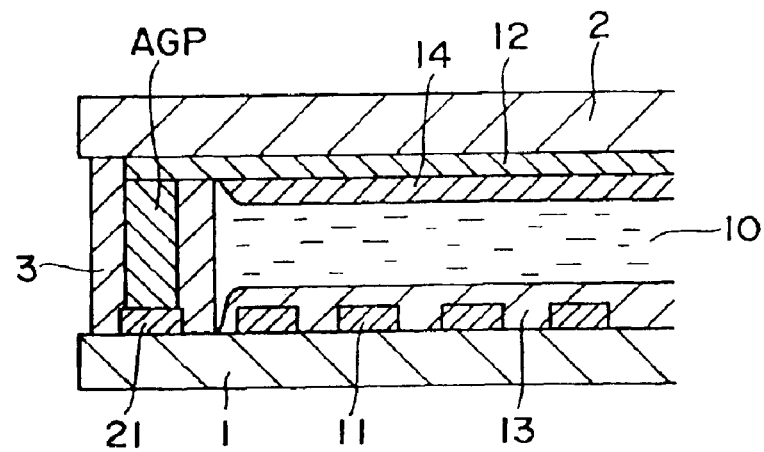
FIG. 6 is a schematic view outlining a structure of a connecting region 25 shown in FIG. 5.

FIG. 6 is a schematic view outlining a typical structure of a connecting region 25 shown in FIG. 5. In this structure, silver paste (AGP) is formed in the sealing material 3. The inclusion of the silver paste in the sealing material 3 allows the common-side liquid crystal output wires (21a and 21b, or part of the segment-side liquid crystal output wires 20) to supply the common voltage to the common electrodes 12. In such a case, the sealing material 3 and the silver paste (AGP) may be formed by known screen printing techniques.

Figure 7:
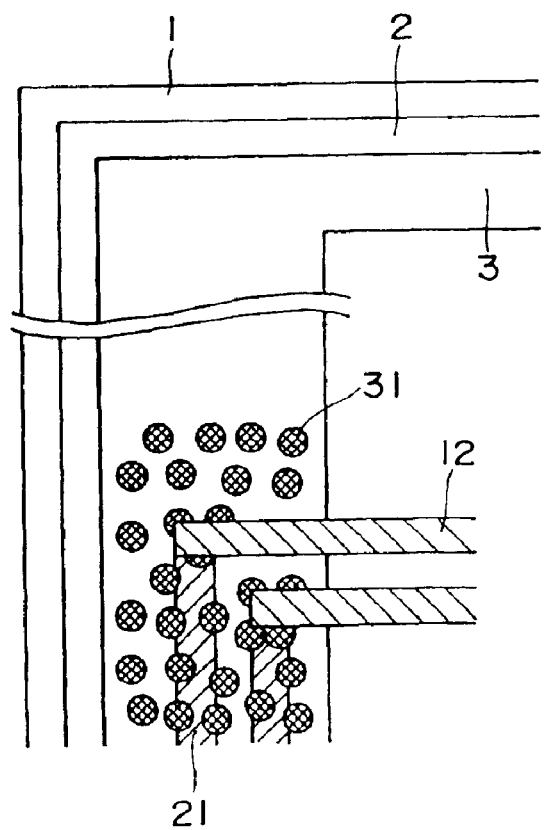
FIG. 7 is a schematic view outlining another structure of the connecting region 25 in FIG. 5.

FIG. 7 is a schematic view outlining another typical structure of the connecting region 25 in FIG. 5. In the structure of FIG. 7, the sealing material 3 is made of an anisotropic conductive material. The sealing material 3 allows the common-side liquid crystal output wires (21a and 21b, or part of the segment-side liquid crystal output wires 20) to supply the common voltage to the common electrodes 12.

The anisotropic conductive material forming the sealing material 3 may illustratively be a synthetic resin having conductive beads 31 dispersed therein. Suitably setting the amount of conductive beads 31 dispersed in the synthetic resin prevents short-circuiting between contiguous common-side liquid crystal output wires (21a, 21b) and between the common electrodes 12 in the connecting regions 25.

The conductive beads 31 shown in FIG. 7 may be any of those coated with transparent conductive films, with metallic powder or with carbon, or of metallic or otherwise conductive beads. In FIG. 7, the conductive beads 31 may be replaced by conductive fibers (ACF).

In FIG. 5, the input/output wires 22 are drawn out to an edge of the glass substrate 1 and connected there to the heat seal 4. The power supply potential ($V_{CC}$) wiring in the input/output wires 22 has a first region 23 formed extensively over the portion accommodating the LCD controller (LSI); the reference potential ($G_{ND}$) wiring in the input/output wires 22 has a second region 24 also furnished extensively in the portion accommodating the LCD controller. The connecting regions 25 in FIG. 5 are made of wires for interconnecting the pads of the LCD controller, as will be described later.

Figure 9:
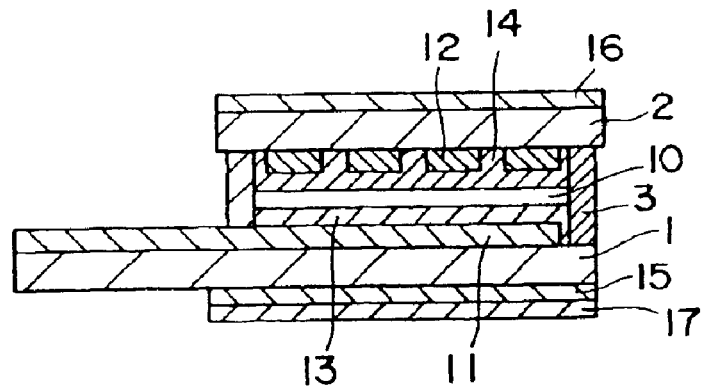
FIG. 9 shows partial cross-sectional views depicting further steps for fabricating the liquid crystal display module (LCM) embodying the invention.
Figure 9:
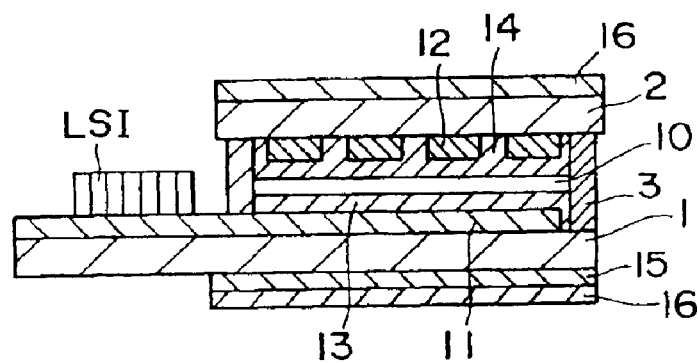
Figure 9:
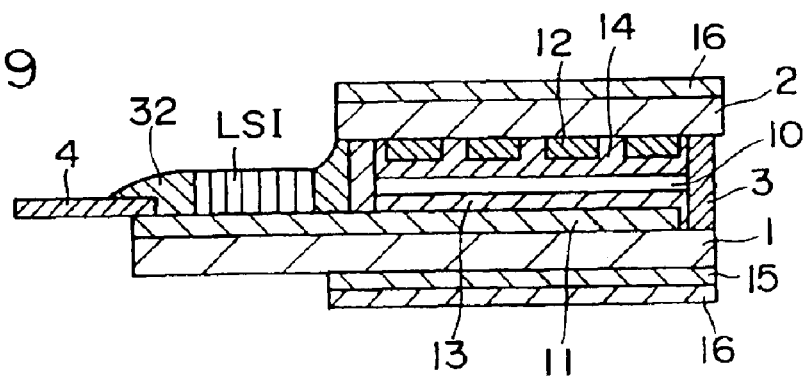

FIGS. 8 and 9 are partial cross-sectional views depicting steps to fabricate the liquid crystal display module (LCM) embodying the invention. Described below with reference to FIGS. 8 and 9 is a method for fabricating the liquid crystal display module embodying the invention.

(1) Step 1
The glass substrates 1 and 2 are cleaned (FIG. 8(a)).
(2) Step 2
An ITO film is formed by deposition or by sputtering over the glass substrate 2. Then the common electrodes 12 are formed by photolithography on the film. In like manner, the segment electrodes 11, liquid crystal output wires (segment-side liquid crystal output wires 20 and common-side liquid crystal output wires 21), input/output wires 22, first region 23, second region 24, and pad-to-pad connection wiring 25 are formed over the glass substrate 1 (FIG. 8(b)).
(3) Step 3
The oriented films 13 and 14 are formed over the entire surfaces of the glass substrates 1 and 2, including the surfaces of the segment electrodes 11 on the glass substrate 1 and of the common electrodes 12 on the glass substrate 2. The forming of the oriented films is followed by a rubbing process (FIG. 8(c)).
(4) Step 4
The sealing material 3 is applied onto the periphery of the glass substrate 1 (FIG. 8(d)).
(5) Step 5
The pattern surfaces of the glass substrates 1 and 2 are put together. With the external surfaces of the glass substrates 1 and 2 subjected to pressure, heat is applied so as to harden the sealing material 3, whereby the glass substrates 1 and 2 are bonded together and sealed (FIG. 8(e)).
(6) Step 6
The liquid crystal layer 10 is injected through an opening 30 of the sealing material 3, and the opening 30 is sealed by epoxy resin or the like. Then the deflection plate 15 and phase different plate 17 are formed outside the glass substrate 1, and the deflection plate 16 is formed outside the glass substrate 2 (FIG. 9(f)).
(7) Step 7
With the glass substrate 1 and LCD controller (LSI) suitably positioned to each other, the controller is bonded face down to the substrate. The bonding connects gold bumps deposited on the pads of the LCD controller to the transparent conductive film (ITO) over the glass substrate 1. This in turn connects the pads of the LCD controller to the liquid crystal output wires (segment-side liquid crystal output wires 20 and common-side liquid crystal output wires 21), to the input/output wires 22, and to the pad-to-pad connection wiring 25 (FIG. 9(g)).
(8) Step 8
The input/output wires 22 drawn out to an edge of the glass substrate 1 and the heat seal 4 are suitably positioned to one another. Applying pressure and heat to the heat seal 4 using a heat tool connects it to the edge of the glass substrate 1. Then exposed portions are coated with insulating resin such as polyimide resin, epoxy resin or silicone resin which forms a protective film 32 (FIG. 9(h)).

Figures 10, 10A, 10B:
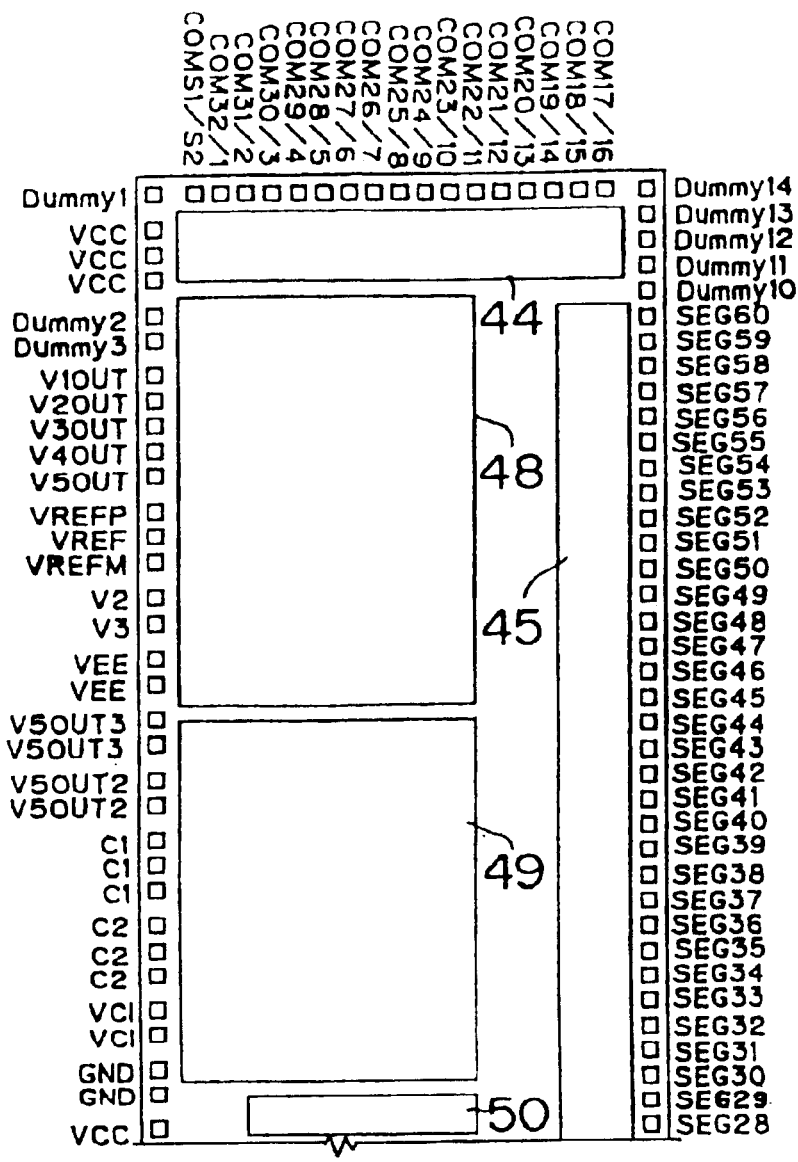
FIG. 10 is a schematic view showing how input/output terminals and function modules inside an LCD controller (LSI) are laid out in the embodiment of the invention.
Figure 10B:
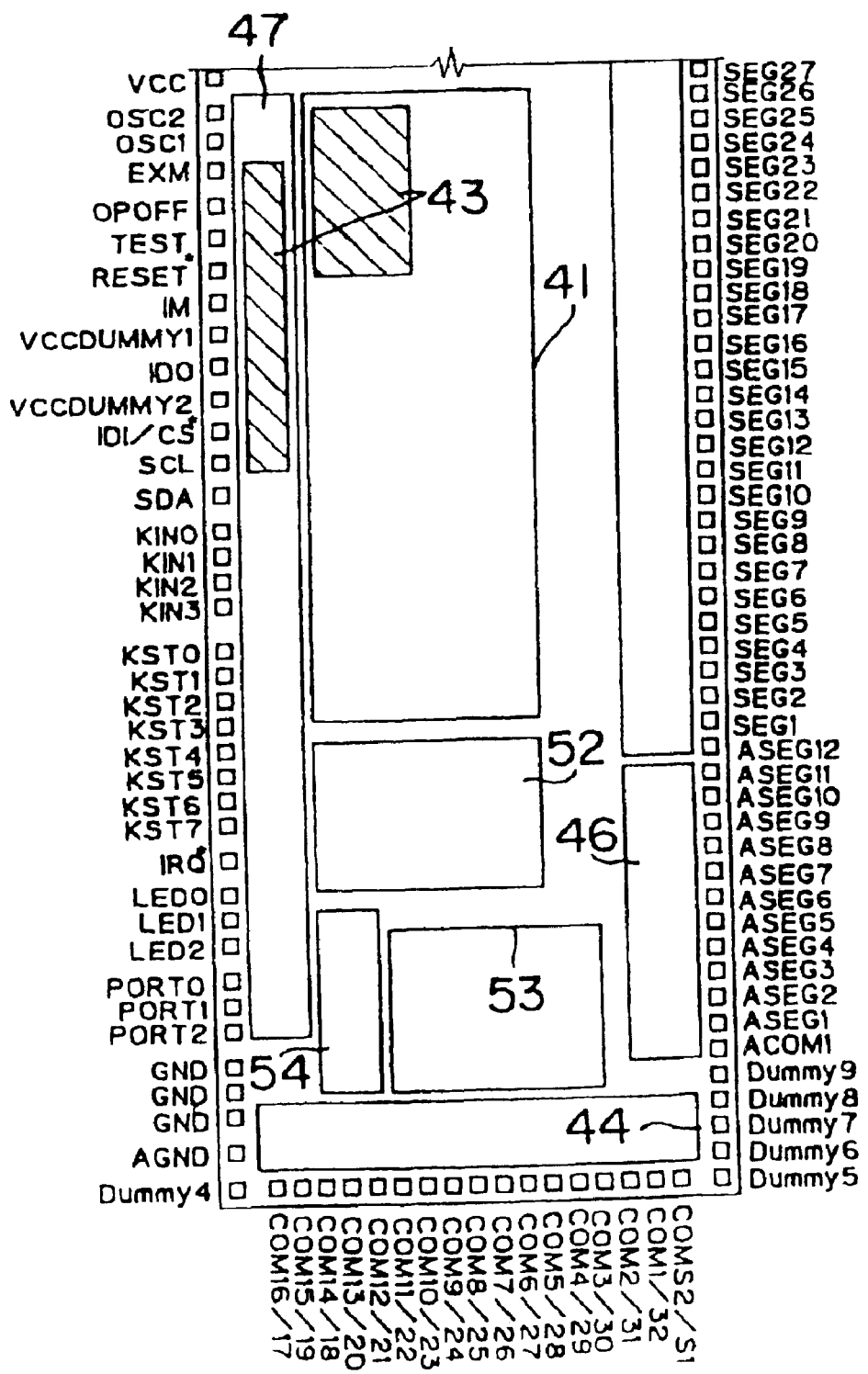

FIG. 10 is a schematic view showing how function modules and input/output terminals inside the LCD controller (LSI) are laid out in the embodiment. In FIG. 10, a common drive block 44 and a segment driver block 45 are provided to display images on the LCD panel on a time division drive basis. The common driver block 44 outputs the common voltage via terminals COM1 through COM32 and COMS2 to the common electrodes 11 inside the LCD panel. The segment driver block 45 outputs the segment voltage via terminals SEG1 through SEG60 to the segment electrodes 11 inside the LCD panel.

An annunciator display block 46 causes an icon or a marking to appear on the LCD panel on a static drive basis. In operation, the block 46 outputs a static drive common voltage via a terminal ACOM1 to part of the common electrodes 12 in the LCD panel, and a static drive segment voltage via terminals ASEG1 through ASEG12 to part of the segment electrodes 11 inside the LCD panel.

When the reference potential ($G_{ND}$) is input to a terminal (OPOFF), an operation amplifier block 48 divides the potential between the power supply potential ($V_{CC}$) and a second reference potential ($V_{EE}$) to output liquid crystal driving voltages at five levels (V1 through V5). When the power supply potential ($V_{CC}$) is input to the terminal OPOFF, the operation amplifier block 48 is turned off. This allows liquid crystal driving voltages at five levels (V1 through V5) to be input from the outside via terminals V1OUT through V5OUT. Terminals VREFP, VREF and VREFM are used to adjust driving capabilities of incorporated operation amplifiers in accordance with the liquid crystal driving voltage in effect.

A booster circuit block 49 doubles (or triples) the voltage input to a terminal VCI, and outputs the boosted voltage via a terminal V5OUT2 or V5OUT3. When the terminal V5OUT2 or V5OUT3 is connected externally to a terminal VEE, the second reference potential $V_{EE}$ is provided thereby in the LCD controller (LSI). Where the booster circuit block 49 is to be used, a booster capacitor is connected interposingly between terminals C1 and C2.

With a resistor connected between terminals OSC1 and OSC2, an oscillator block 50 generates a clock signal used inside the LCD controller (LSI). If an external clock signal is to be used inside the LCD controller, the signal is input through the terminal OSC1.

A low dielectric strength buffer block 47 accommodates input/output buffer circuits for handling input/output signals. A low dielectric strength logic block 51 holds registers or control circuits. A ROM block 52 and a RAM block 53 retain ROMs and RAMs respectively.

A key scan circuit control block 54 acts as a control block that illustratively detects key input status of a portable telephone. A strobe signal is output on a time division basis from terminals KST0 through KST7, and key status is received through terminals KIN0 through KIN3 in synchronism with the strobe signal.

A terminal IM is used to select a serial interface mode between the inventive liquid crystal display module (LCM) and the central processing unit (CPU). The power supply potential $V_{CC}$ fed to the terminal IM causes clock synchronous serial interface mode to be selected. Applying the reference potential $V_{EE}$ to the terminal IM selects I²C bus interface mode. While I²C bus interface mode is in effect, terminals ID1/CS* and ID0 are used to set low-order two bits of a device ID code assigned to the LCD controller (LSI). In serial interface mode, the terminal ID1/CS* is used to receive a chip select signal, and the terminal ID0 is used to set a low-order one bit of the device ID code assigned to the LCD controller.

To set the low-order bits in the device ID code allocated to the LCD controller (LSI) requires that the terminal ID1/CS* or ID0 be always fed with the power supply potential $V_{CC}$ or reference potential $V_{EE}$. From now on, the terminals IM, ID1/CS* and ID0 will be called mode terminals 41.

Figure 11:
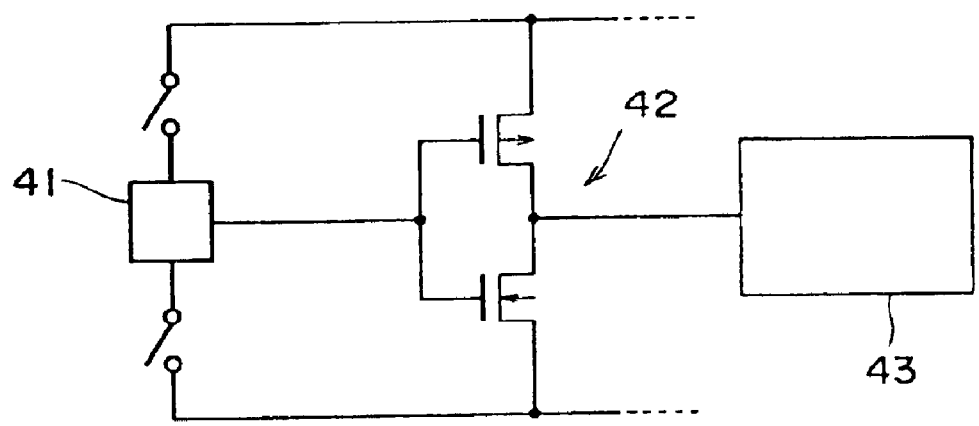
FIG. 11 is a circuit diagram of an internal circuit connected to mode terminals 41 of the LCD controller in the embodiment.

As shown in FIG. 11, the potential supplied to the mode terminals 41 is input to a mode selector circuit 43 through a CMOS inverter circuit 42. The mode selector circuit 43 changes internal status (operation mode or device ID information) of the LCD controller (LSI) in keeping with the potential fed to the mode terminals 41. The circuit modules associated with the mode selector circuit 43 are located close to the mode terminals 41, as illustrated in FIG. 10.

Next to the mode terminals 41 in FIG. 10, a power supply dummy terminal VCCDUMMY1 is provided illustratively between the terminals IM and ID0, and another power supply dummy terminal VCCDUMMY2 between the terminals ID0 and ID1/CS*. These power supply dummy terminals VCCDUMMY1 and VCCDUMMY2 are connected to the wires of the power supply potential $V_{CC}$ inside the LCD controller (LSI). When the pad-to-pad connection wiring 25 connects the terminals IM, ID0 and ID1/CS* to the power supply dummy terminals VCCDUMMY1 and VCCDUMMY2, the power supply potential $V_{CC}$ is supplied to the terminals IM, ID0 and ID1/CS*. The second region 24 is located close to the terminals IM, ID0 and ID1/CS*. When the terminals IM, ID0 and ID1/CS* are connected to the second region 24, the reference potential $G_{ND}$ is fed to these terminals. Such arrangements reduce the number of input/output wires 22 needed on the glass substrate 1.

Figure 12:
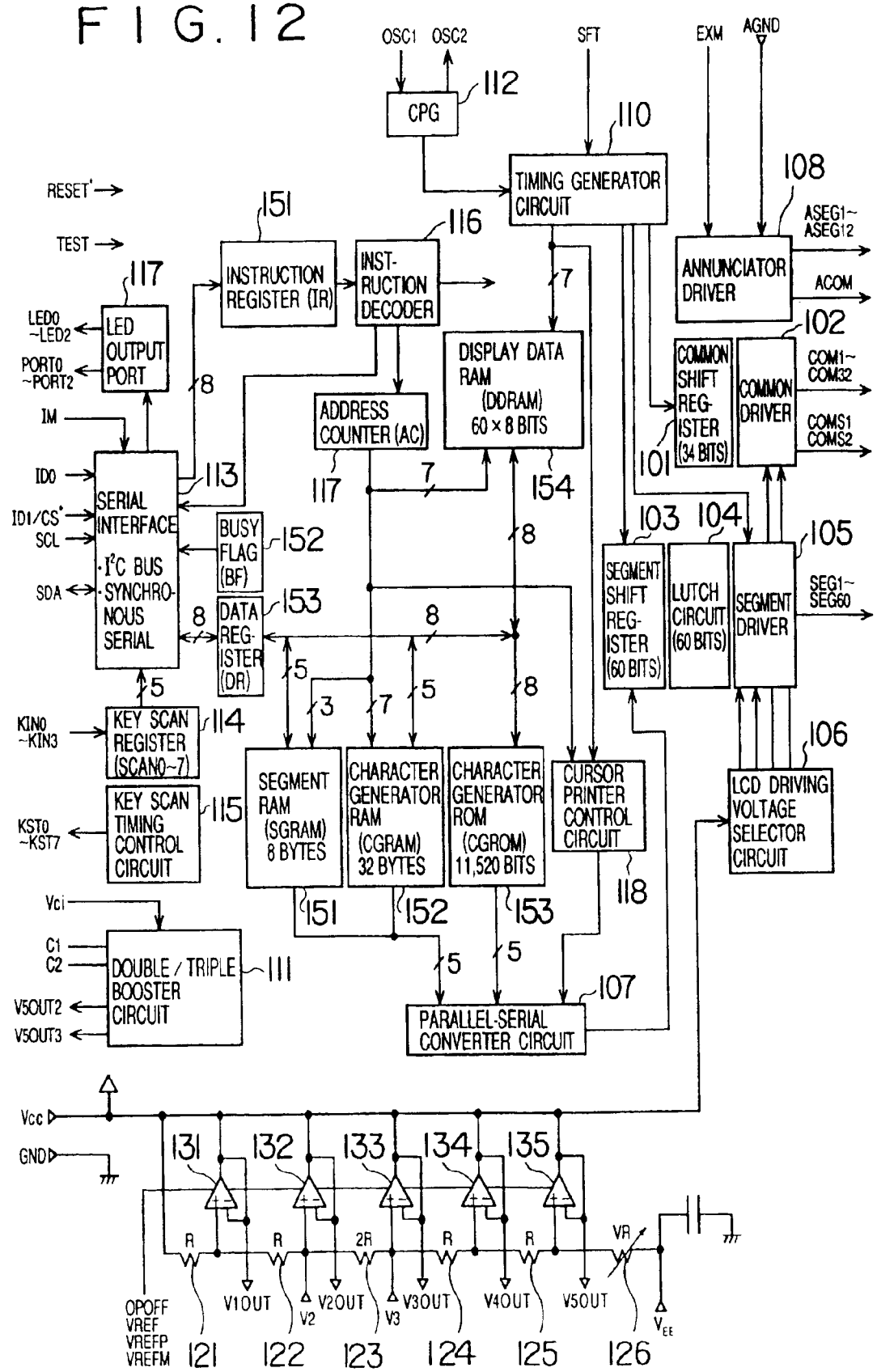
FIG. 12 is a block diagram showing function blocks inside the LCD controller of the embodiment.

FIG. 12 is a block diagram showing function blocks inside the LCD controller (LSI) of the embodiment. The common driver block 44 shown in FIG. 10 comprises a common shift register 101 and a common driver 102. The common shift register 101 selects the common electrodes 12 to be driven per unit horizontal scanning time in accordance with a timing signal for output timing control, the timing signal being input from a timing generator circuit 110. The common driver 101 supplies the selected common electrodes 12 as well as the remaining common electrodes 12 with a suitable liquid crystal driving voltage selected from among different levels of liquid crystal driving voltages coming from a liquid crystal driving voltage selector circuit 106.

The segment driver block 45 shown in FIG. 10 includes a segment shift register 103, a latch circuit 104 and a segment driver 105. The segment shift register 103 generates a display data latch signal based on a display data latch timing signal coming from the timing generator circuit 110. The latch circuit 104 latches display data upon receipt of the display data latch signal, and outputs the latched display data to the segment driver 105 in accordance with the timing signal for output timing control. The segment driver 105 supplies the segment electrodes 11 each having "1" or "0" as display data for a single horizontal scan, with a suitable liquid crystal driving voltage selected from among the different levels of liquid crystal driving voltages coming from the liquid crystal driving voltage selector circuit 106, the selection of the driving voltage being based on the display data.

Figure 13:
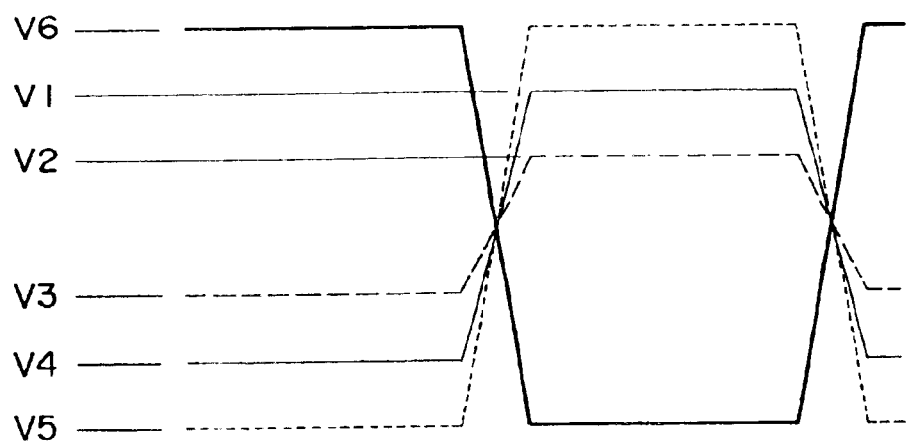
FIG. 13 is a graphic representation illustrating typical behavior of segment voltages fed to segment electrodes 11 and of common voltages supplied to common electrodes 12 under a time division drive scheme of the embodiment.

FIG. 13 is a graphic representation illustrating typical behavior of segment voltages fed to the segment electrodes 11 and of common voltages supplied to the common electrodes 12 under a time division drive scheme of the embodiment. The liquid crystal display module (LCM) of this embodiment adopts what is known as an alternating drive scheme. Under this scheme, the liquid crystal layer 10 is protected against application of DC voltages through periodical inversion of the segment voltage fed to a plurality of segment electrodes 11 and of the common voltage supplied to a plurality of common electrodes 12.

In the example of FIG. 13, suppose that negative polarity is in effect (i.e., the segment voltage fed to the segment electrodes 11 having display data "1" is lower than the common voltage applied to the common electrodes 12). In such a case, the segment electrodes 11 having display data "1" each are supplied with a segment voltage V5 from the liquid crystal driving voltage selector circuit 106; the segment electrodes 11 having display data "0" each are fed with a segment voltage V3 from the circuit 106; the selected common electrodes 12 are given a common voltage V6 by the circuit 106; and the unselected common electrodes 12 are provided with a common voltage V6 from the circuit 106.

Suppose now that positive polarity is in effect in the example of FIG. 13 (i.e., the segment voltage fed to the segment electrodes 11 having the display data "1" is higher than the common voltage supplied to the common electrodes 12). In that case, the segment electrodes 11 having the display data "1" each are supplied with a segment voltage V6 from the liquid crystal driving voltage selector circuit 106; the segment electrodes 11 having the display data "0" each are fed with a segment voltage V2 from the circuit 106; the selected common electrodes 12 are given a common voltage V5 by the circuit 106; and the unselected common electrodes 12 are provided with a common voltage V1 from the circuit 106.

Figure 14:
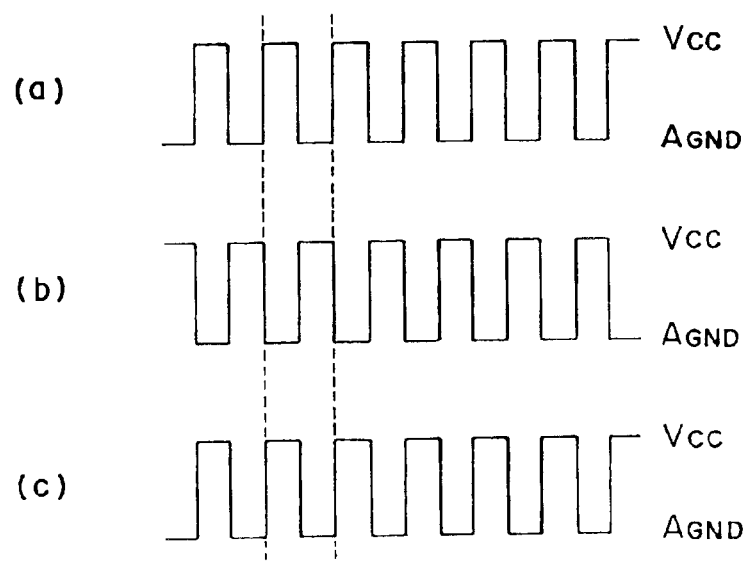
FIG. 14 shows graphic representations depicting typical behavior of the segment voltage fed to the segment electrodes 11 and of the common voltage supplied to the common electrodes 12 under a static drive scheme of the embodiment.

The annunciator display block 46 shown in FIG. 10 includes an annunciator driver 108. The annunciator driver 108 outputs to the selected segment electrodes 11 a segment voltage whose waveform is shown in FIG. 14(*b*), outputs a segment voltage with its waveform indicated in FIG. 14(*a*) to the unselected segment electrodes 11 connected to terminals ASEG1 through ASEG12, and outputs a common voltage with its waveform depicted in FIG. 14(*c*) to the common electrodes 12 connected to a terminal ACOM1.

In the above setup, no liquid crystal driving voltage is fed to the liquid crystal layer 10 between the unselected segment electrodes 11 connected to the terminals ASEG1 through ASEG12 on the one hand, and the common electrodes 12 connected to the terminal ACOM1 on the other hand. A liquid crystal driving voltage with a potential difference of $2\times(V_{CC}-A_{GND})$ is applied to the liquid crystal layer 10 between the selected segment electrodes 11 connected to the terminals ASEG1 through ASEG12 on the one hand, and the common electrodes 12 connected to the terminal ACOM1 on the other hand.

The operation amplifier block 48 indicated in FIG. 10 comprises a series resistance circuit with five resistors 121 through 125 and a variable resistor 126 connected in series, and five voltage follower circuits 131 through 135 connected to the points of connection between the resistors. When the reference potential $G_{ND}$ is input to the terminal OPOFF, the potential between the power supply potential $V_{CC}$ and the second reference potential $V_{EE}$ is divided so that five levels of liquid crystal driving voltages V1 through V5 are output from the voltage follower circuits 131 through 135.

The liquid crystal driving voltages at five levels V1 through V5 and the power supply potential $V_{CC}$ (liquid crystal driving voltage V6) are output to the liquid crystal driving voltage selector circuit 106.

A booster circuit 111 and a clock signal generator circuit 112 constitute respectively the booster circuit block 49 and the oscillator block 50 shown in FIG. 10.

A character generator ROM 153 generates five-by-eight bit character patterns based on eight-bit character codes. The character generator ROM 153 is included in the ROM block 52 shown in FIG. 10.

A display data RAM 154 constitutes a random access memory that stores eight-bit character codes. A character generator RAM 152 is a user font random access memory wherein a user may rewrite character patterns by program as desired. A segment RAM 151 is a random access memory allowing a user program to control segments such as icons or markings as needed. The display data RAM 154, character generator RAM 152 and segment RAM 151 are included in the RAM block 53 shown in FIG. 10.

A cursor blink control circuit 118 is used to blink the cursor on display or to reverse the displayed cursor monochromatically. Display data (dot data) from the cursor blink control circuit 118, segment RAM 151, character generator RAM 152 and character generator ROM 153 are converted to serial data by a parallel-serial converter circuit 107. The converted data are sent to the latch circuit 104. The parallel-serial converter circuit 107 and cursor blink control circuit 118 are included in the low dielectric strength logic block 51 shown in FIG. 10.

For a serial interface 113, either clock synchronous serial interface mode or I²C bus interface mode is selected depending on the voltage fed to the terminal IM. Address information and data transmitted from the CPU via the serial interface 113 are retained by an instruction register 151 and a data register 153. The address information placed in the instruction register 151 is separated by an instruction decoder 116 into two kinds of address information: address information for the display data RAM 154; and address information for the segment RAM 151, character generator RAM 152 and character generator ROM 153.

The address information separated by the instruction decoder 116 for the segment RAM 151, character generator RAM 152 and character generator ROM 153 is input to an address counter 117. With its address information, the address counter 117 causes the segment RAM 151, character generator RAM 152 and character generator ROM 153 to be accessed.

The instruction decoder 116, address counter 117, instruction register 151, data register 153 and a busy flag 152 are included in the low dielectric strength logic block 51 shown in FIG. 10.

LED output ports 119 comprise three LED driving ports connected to terminals LED0 through LED2 and three general-purpose output ports connected to terminals PORT0 through PORT2. LEDs connected to the terminals LED0 through LED2 are turned on and off by way of the serial interface 113. The LED output ports 119 are included in the low dielectric strength logic block 51 shown in FIG. 10.

Given a clock signal from the clock signal generator circuit 112, the timing generator circuit 110 generates a timing signal by which to operate such internal circuits as the common shift register 101, segment shift register 103, latch circuit 104, display data RAM 154, character generator RAM 152 and segment RAM 151. The timing generator circuit 110 is included in the low dielectric strength logic block 51 shown in FIG. 10.

The key scan circuit control block 54 indicated in FIG. 10 comprises a key scan timing control circuit 115 and a key scan register 114.

Figures 15, 15A, 15B:
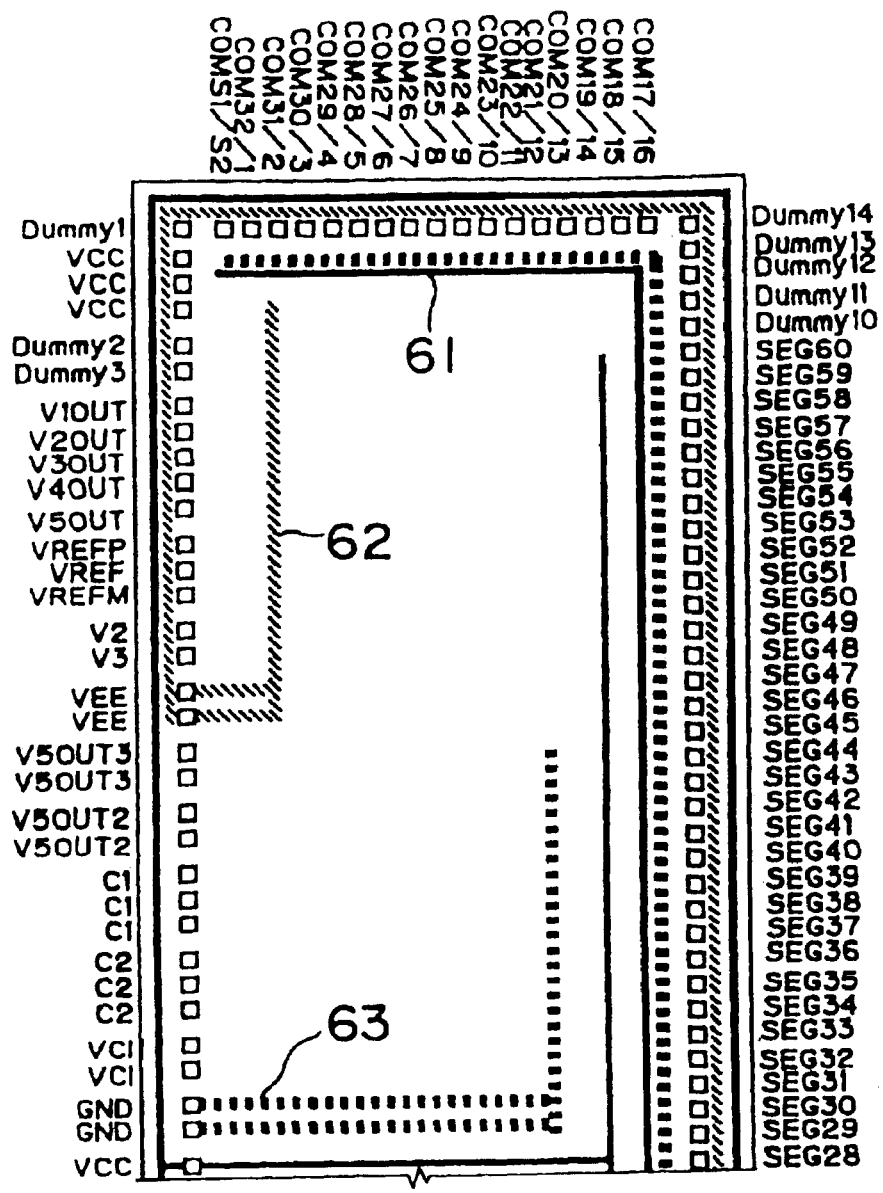
FIG. 15 is a schematic view of power supply wiring inside a semiconductor integrated circuit (LSI) of the embodiment.
Figure 15B:
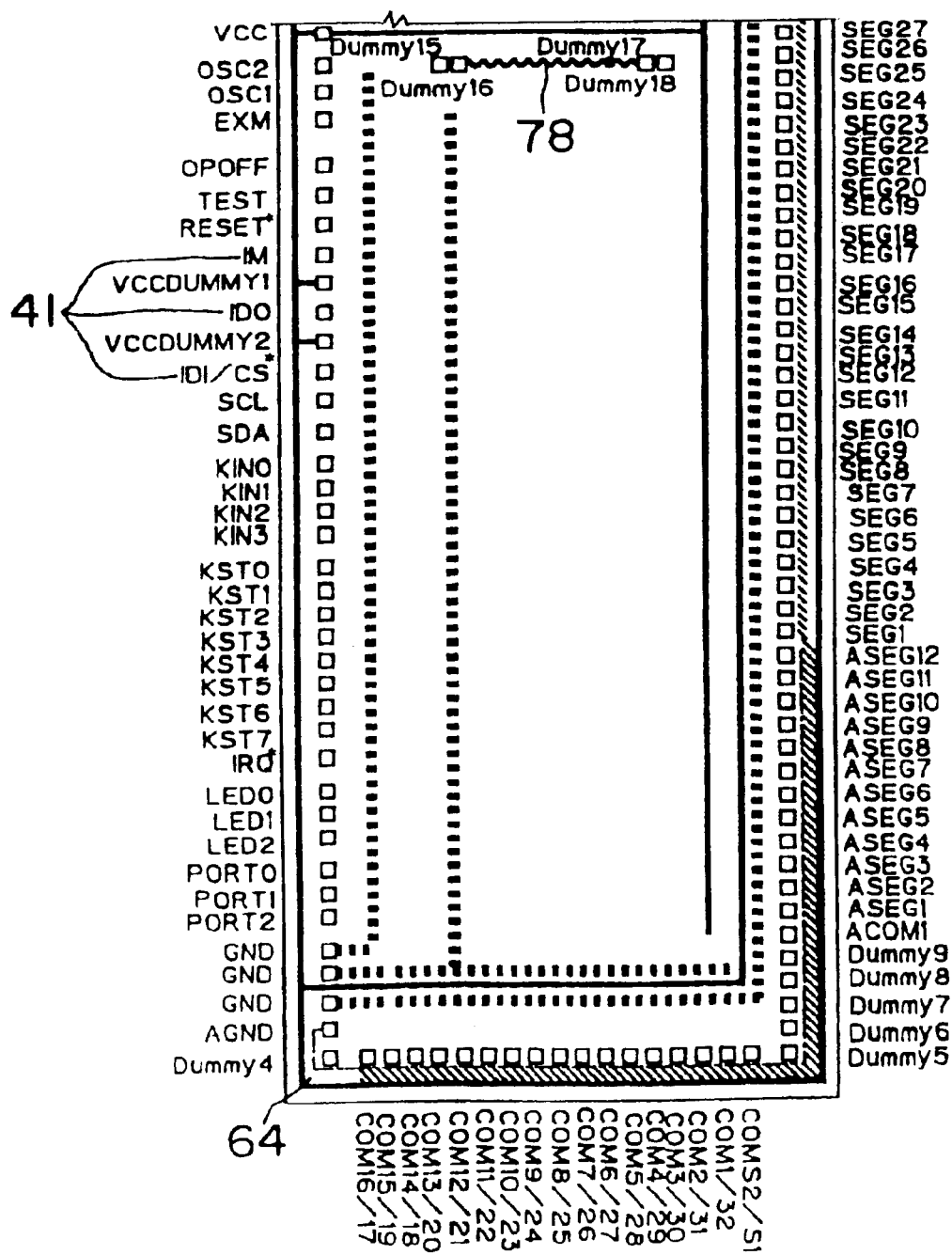

FIG. 15 is a schematic view of power supply wiring inside a semiconductor integrated circuit (LSI) of the embodiment. In FIG. 15, reference numeral 61 stands for power supply wiring of the power supply potential $V_{CC}$, 62 for power supply wiring of the second reference potential $V_{EE}$, 63 for power supply wiring of the reference potential $G_{ND}$, and 64 for power supply wiring of a third reference potential $A_{GND}$. As depicted in FIG. 15, the power supply dummy terminals VCCDUMMY1 and VCCDUMMY2 are connected to the power supply wiring 61.

Figures 16, 16A:
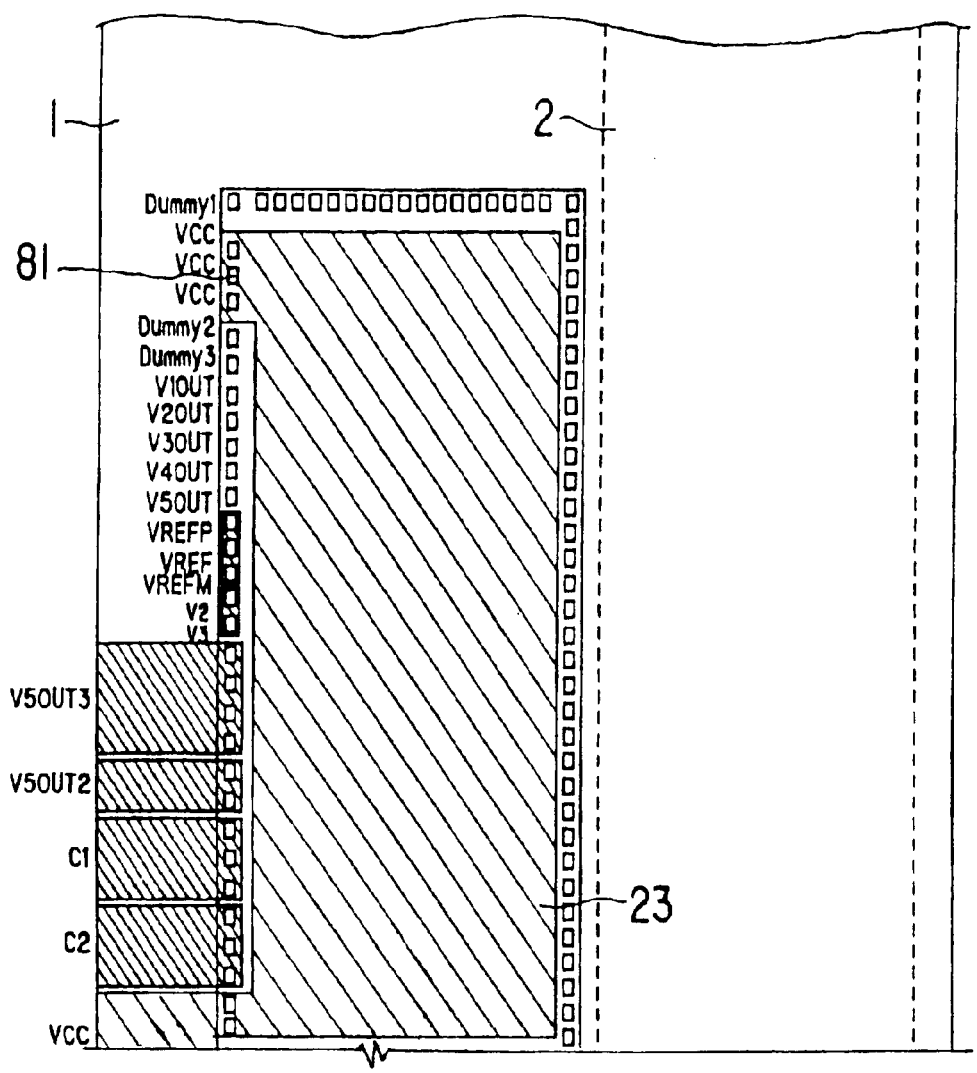
FIG. 16 is a schematic view illustrating specific wiring patterns of a transparent conductive film (ITO) on that portion of a glass substrate 1 which carries an LCD controller (LSI), the patterns being shown relative to the LCD controller.
Figure 16B:
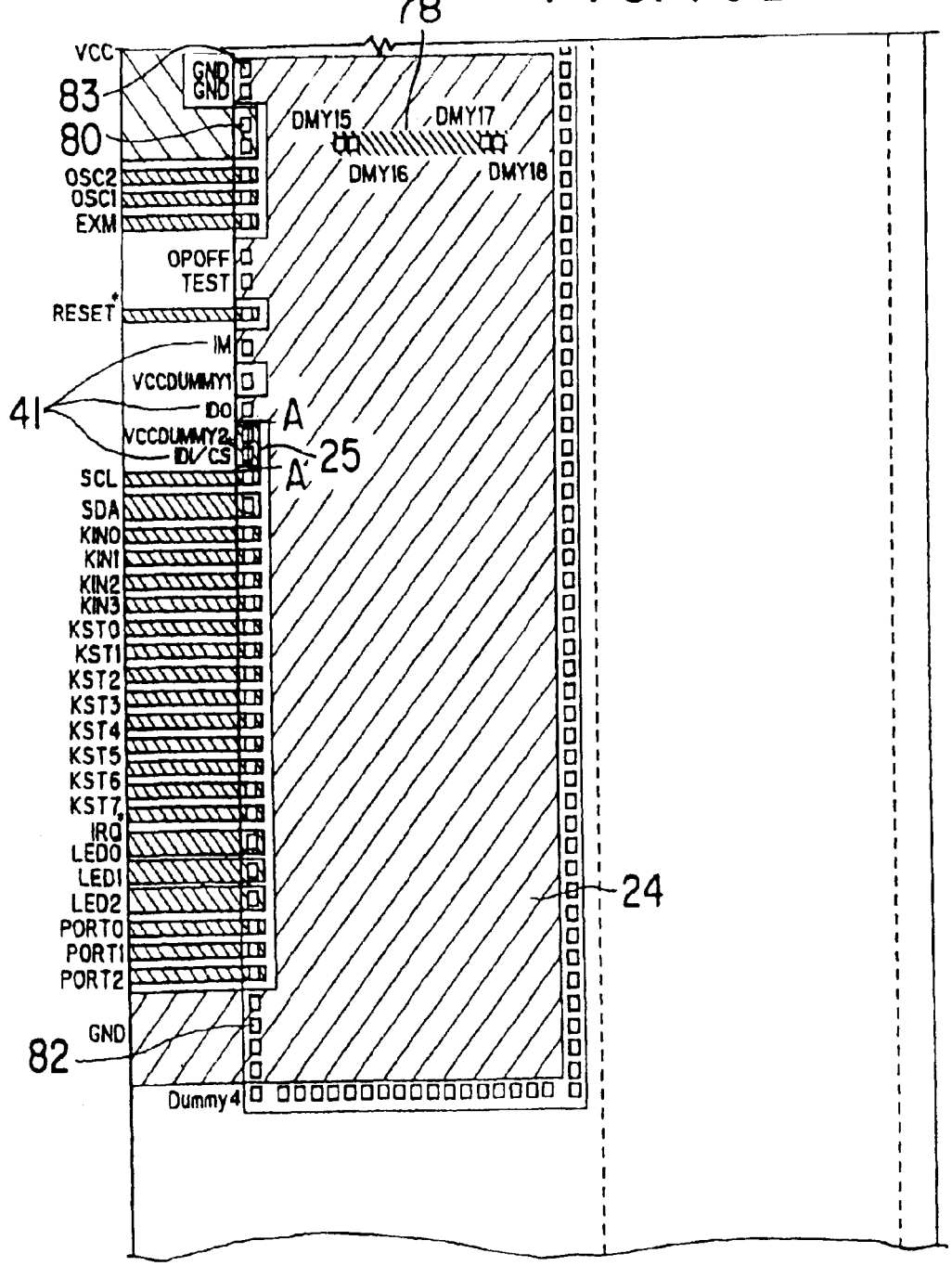

FIG. 16 is a schematic view illustrating specific wiring patterns of a transparent conductive film (ITO) on that portion of the glass substrate 1 which carries the LCD controller (LSI), the patterns being shown relative to the LCD controller.

In FIG. 16, the power supply potential $V_{CC}$ is input to a power supply potential terminal (VCC) 80, and the reference voltage $G_{ND}$ to a reference potential terminal (GND) 82. The terminal OPOFF is connected via the second region 24 to the reference potential terminal (GND) 82. In this setup, the operation amplifier block 48 divides the difference between the power supply potential $V_{CC}$ and the second reference potential $V_{EE}$ so that the voltage follower circuits output five levels of liquid crystal driving voltages V1 through V5.

The terminal VCI is connected to the power supply potential terminal (VCC) 80 via the transparent conductive film (ITO) formed on the glass substrate 1 outside the LCD controller (LSI). In this arrangement, the booster circuit block 49 triples the power supply potential $V_{CC}$ and outputs the boosted potential through a terminal V5OUT3. The terminal V5OUT3 is connected to a terminal VEE (to which to input the second reference potential $V_{EE}$) via the transparent conductive film (ITO) formed over the glass substrate 1 outside the LCD controller.

The terminal IM, one of the mode terminals 41, is connected via the second connecting region 24 to the reference potential terminal (GND) 82. This allows the LCD controller (LSI) mounted on the wiring patterns in FIG. 16 to exchange data with the CPU in I²C bus interface mode. The terminal ID1/CS*, another mode terminal 41, is connected to the power supply dummy terminal VCC-DUMMY2 via the pad-to-pad connection wiring 25. The terminal ID0, yet another mode terminal 41, is connected to the reference potential terminal (GND) 82 via the second connecting region 24.

In FIG. 16, the first connecting region 23 is also connected to power supply terminals (VCC) 81 shown in the top left corner. The connection is made because the power supply terminals (VCC) 81 are connected inside the LCD controller (LSI) to those different power supply wires (not shown in FIG. 15) of the power supply potential $V_{CC}$ which are not connected to the power supply wiring 61 in FIG. 15. The second connecting region 24 is also connected to reference power supply terminals (GND) 83. This connection is made because the power supply wires 63 of the reference potential $G_{ND}$ are divided inside the LCD controller (LSI) into two portions as shown in FIG. 15, the two portions of the reference potential ($G_{ND}$) wires 63 being disconnected from one another inside the LCD controller.

In FIG. 16, terminals DMY15 through DMY18 are dummy terminals. Reference numeral 78 denotes aluminum (Al) jumper wiring. The reasons why the terminals DMY 15 through DMY18 as well as the aluminum jumper wiring 78 are provided where they are will be described later.

Figure 17:
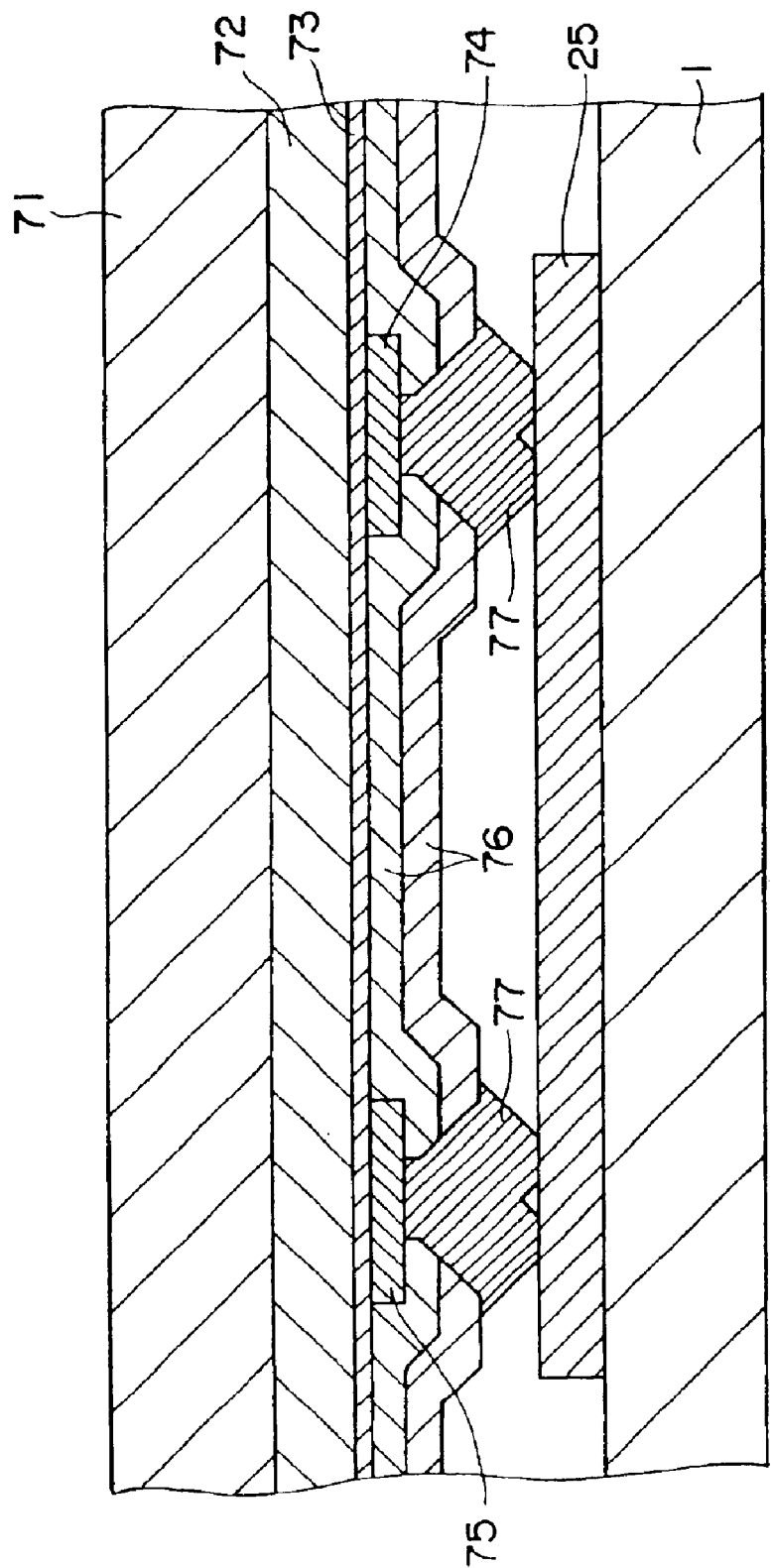
FIG. 17 is a cross-sectional view taken on line A–A' in FIG. 16 where a terminal ID1/CS* and a power supply dummy terminal VCCDUMMY2 are connected, the view including a cross-section of the LCD controller (LSI)

FIG. 17 is a cross-sectional view taken on line A-A' in FIG. 16 where the terminal ID1/CS* and the power supply dummy terminal VCCDUMMY2 shown in FIG. 16 are connected, the view including a cross-section of the LCD controller (LSI). As shown in FIG. 17, the terminal ID1/CS* is made up of an aluminum pad 74 and a gold bump 77 which permits connection with the transparent conductive film (ITO). The power supply dummy terminal VCC-DUMMY2 is composed of an aluminum pad 75 and a gold bump 77. The gold bumps 77 are formed illustratively by deposition.

In the manner described, the terminal ID1/CS* and the power supply dummy terminal VCCDUMMY2 are connected through the following route: from the aluminum pad 74 to the gold bump 77 to the pad-to-pad connection wiring (transparent conductive film (ITO)) to the gold bump 77 to the aluminum pad 75. In FIG. 17, reference numeral 71 stands for a wafer substrate, 72 for a field oxide film (selected silicon dioxide film), 73 for an interlayer film, and 76 for a protective film (passivation film).

Figures 18, 18A:
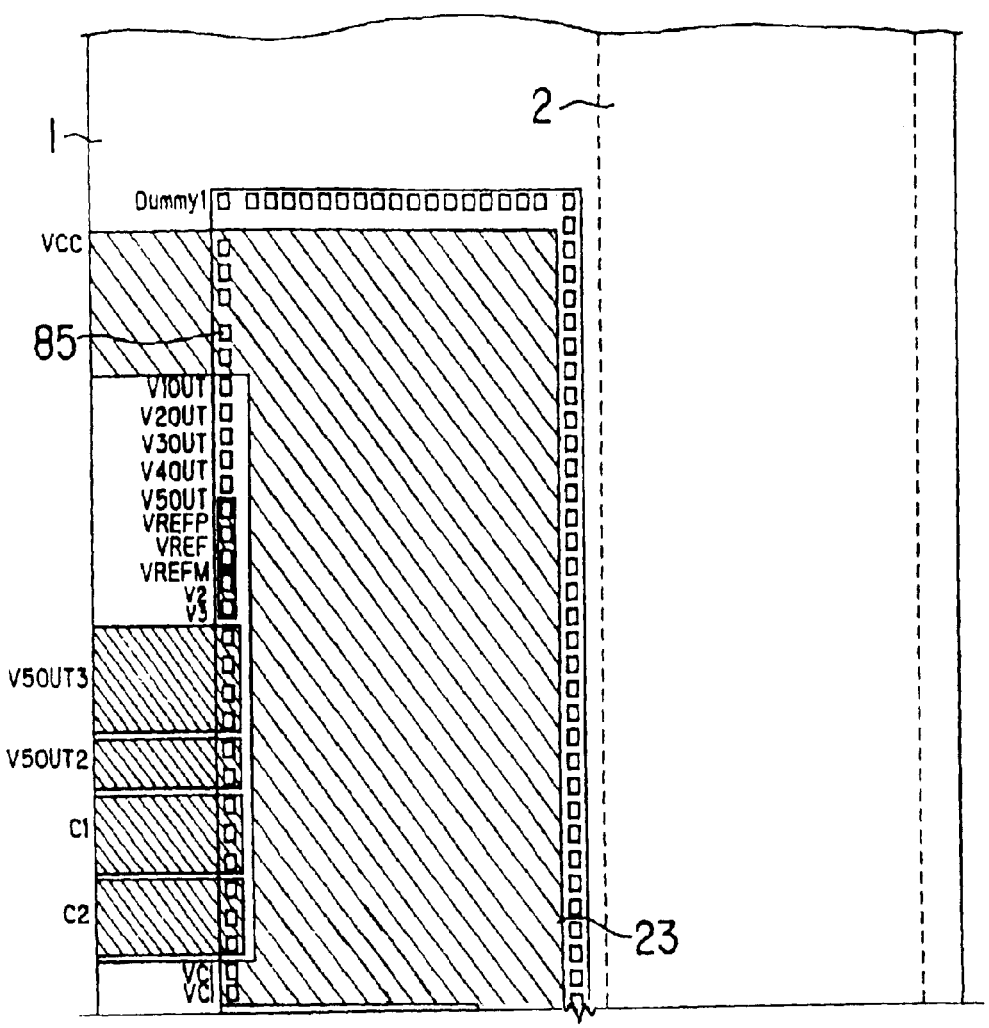
FIG. 18 is a schematic view indicating other specific wiring patterns of the transparent conductive film (ITO) on that portion of the glass substrate 1 which carries the LCD controller (LSI), the patterns being shown relative to the LCD controller.
Figure 18B:
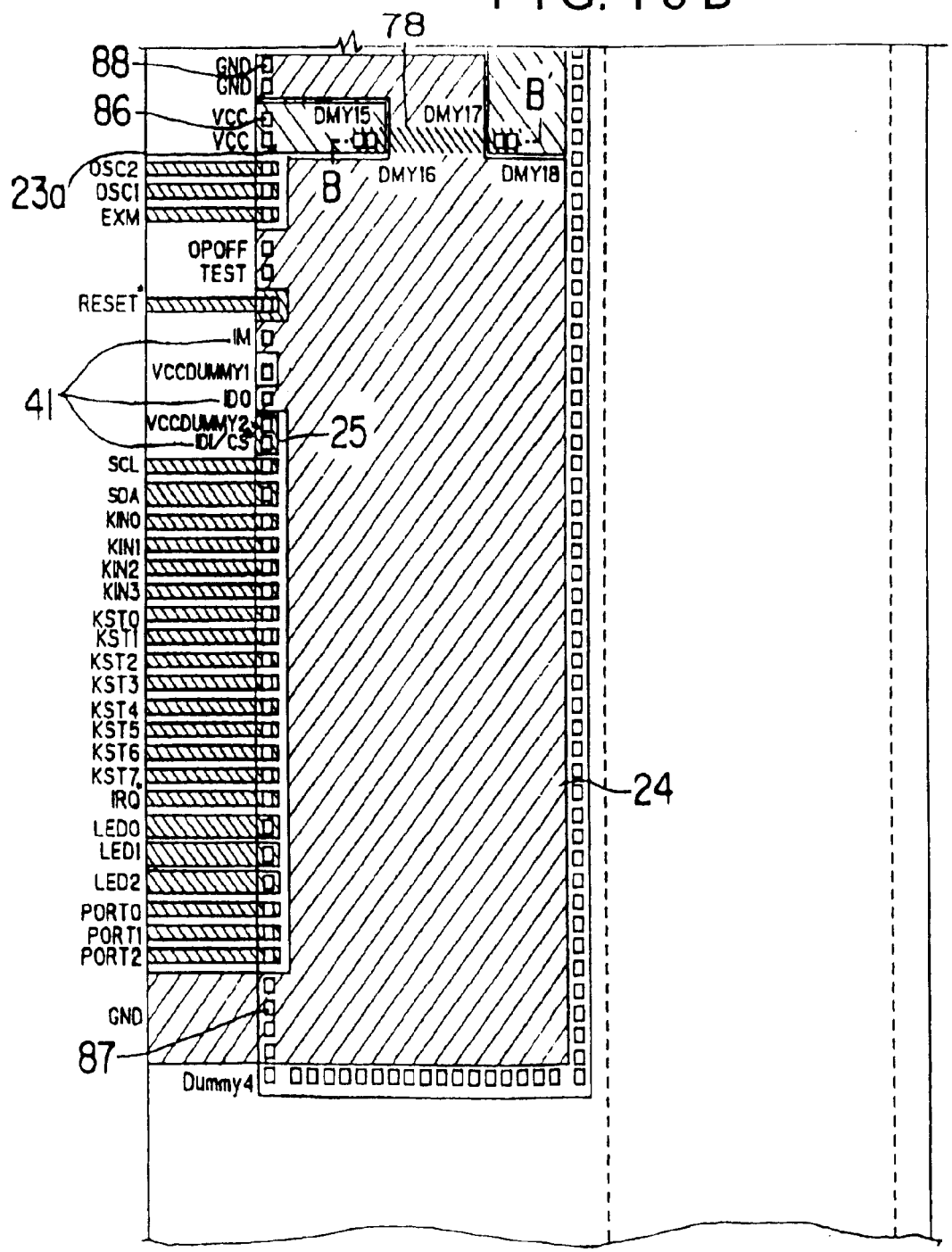

FIG. 18 is a schematic view indicating other specific wiring patterns of the transparent conductive film (ITO) on that portion of the glass substrate 1 which carries the LCD controller (LSI), the patterns being shown relative to the LCD controller. In FIG. 18, the power supply potential $V_{CC}$ is input to a power supply potential terminal (VCC) 85, and the reference potential $G_{ND}$ to a reference potential terminal (GND) 87. As described above, the power supply terminal (VCC) 85 and a power supply potential terminal (VCC) 86 in the middle are not connected inside the LCD controller (LSI). Likewise, the reference potential terminal (GND) 87 and a reference potential terminal (GND) 88 in the middle are not connected within the LDC controller (LSI).

In the above setup, as shown in FIG. 16, the transparent conductive film (ITO) formed on the glass substrate 1 outside the LCD controller is used to connect the power supply terminal (VCC) 85 to the centrally located power supply potential terminal (VCC) 86. On the other hand, it may be desired to connect the power supply terminal (VCC) 85 to the power supply potential terminal (VCC) 86 in the middle by use of the transparent conductive film (ITO) formed over the glass substrate 1 which carries the LCD controller (LSI).

In the latter case, it is required to cross the first connecting region 23 and the second connecting region 24. The crossing requirement is met in the example of FIG. 18 by furnishing a third connecting region 23a and by connecting the region 23a with the first connecting region 23 through the use of the aluminum jumper wiring 78 inside the LCD controller (LSI). The other arrangements are the same as those for the wiring patterns in FIG. 16.

Figure 19:
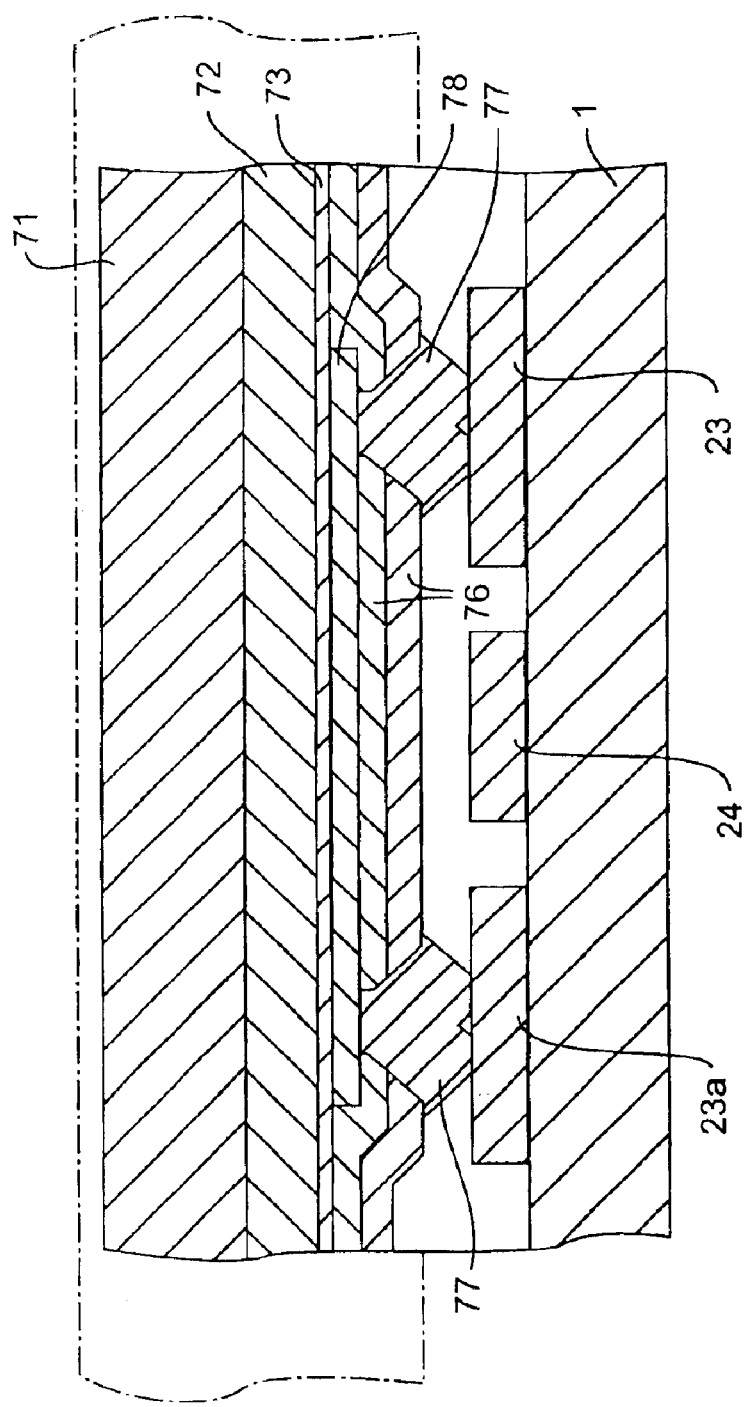
FIG. 19 is a cross-sectional view taken on line B–B' in FIG. 18 where dummy terminals DAY16 and DAY17 are connected, the view including a cross-section of the LCD controller (LSI)

FIG. 19 is a cross-sectional view taken on line B–B' in FIG. 18 where dummy terminals DMY 16 and DMY 17 shown in FIG. 18 are connected, the view including a cross-section of the LCD controller (LSI). As shown in FIG. 19, the dummy terminals DMY 16 and DMY 17 are interconnected via the aluminum jumper wiring 78. Thus the power supply terminal (VCC) 85 and the power supply potential terminal (VCC) 86 in the middle are connected through the following route: from the third connecting region 23a to the gold bump 77 to the aluminum jumper wiring 78 to the gold bump 77 to the first connecting region 23.

In the inventive liquid crystal display module (LCM), as will be appreciated from FIGS. 16 and 18, the power supply wires feeding supply voltages to the LCD controller (LSI) can be drawn not only from the middle of the LCD controller (LSI) but also from the latter's edge (upper or lower edge) for connection to the heat seal 4. This feature allows the liquid crystal display module (LCM) to layout its power supply wires to better accommodate the power supply wiring arrangements on a printed circuit board used in a portable apparatus. As such, the module can effectively address diverse kinds of printed circuit boards incorporated in portable equipment.

Figure 20:
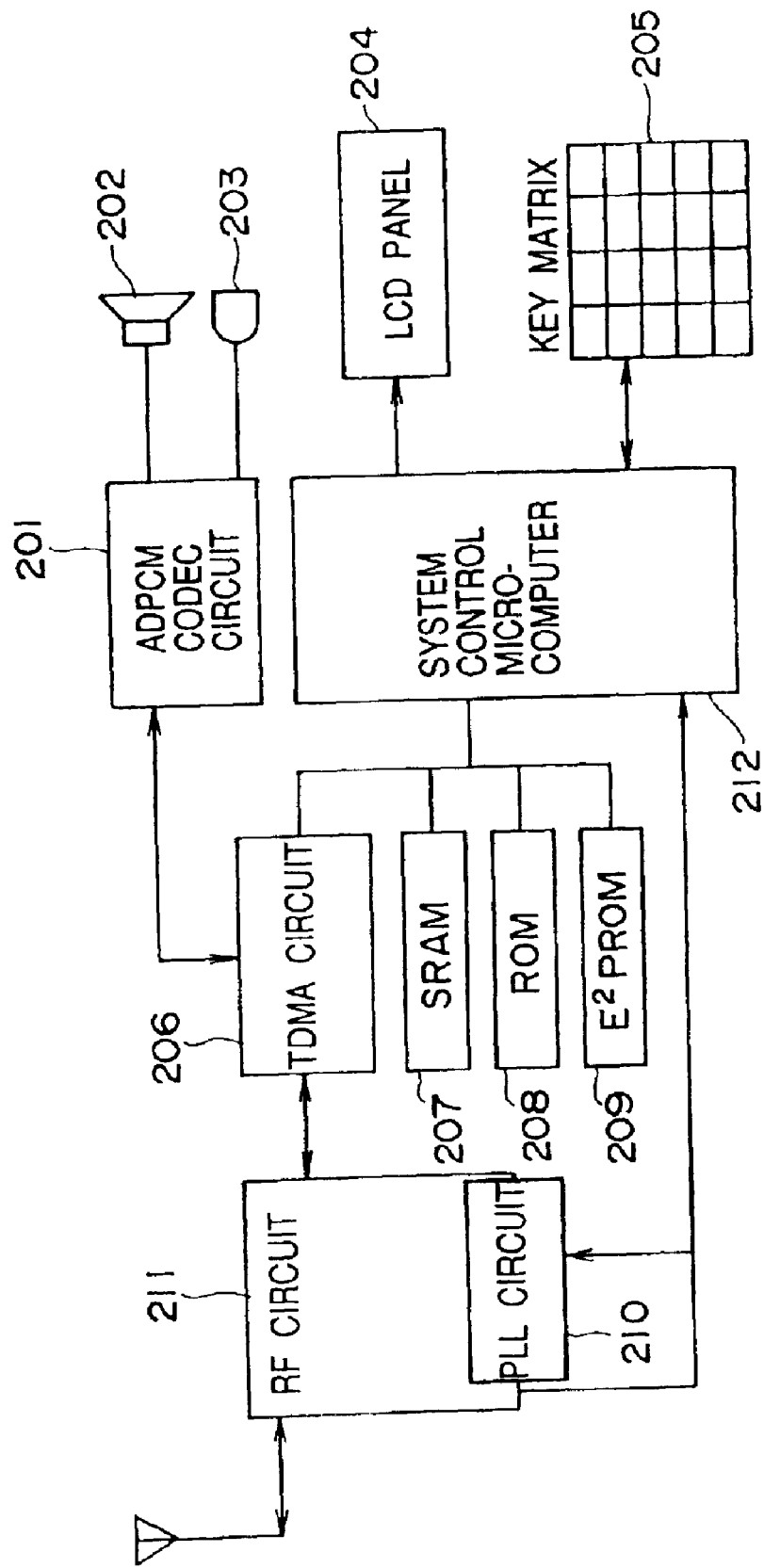
FIG. 20 is a block diagram outlining a conventional PHS system that utilizes the liquid crystal display module (LCM) embodying the invention.

Illustratively, the liquid crystal display module (LCM) embodying the invention may be used as a display device of a PHS system, one of today's portable telephone systems. FIG. 20 is a block diagram outlining a conventional PHS system that utilizes the inventive liquid crystal display module (LCM).

The PHS system in FIG. 20 comprises an ADPCM CODEC circuit 201 for contracting and expanding audio data, a speaker 202, a microphone 203, a liquid crystal display panel 204, a keyboard 205, a TDMA circuit 206 for multiplexing digital data on a time division basis, an $E^2PROM$ 209 for storing a registered ID number, a ROM 208 and an SRAM 207 for storing programs, a PLL circuit 210 for establishing a radio carrier frequency, an RF circuit 211 for sending and receiving data by radio, and a microcomputer 212 for controlling the configured components. The inventive liquid crystal display module (LCM) may be used as the liquid crystal display panel 204 shown in FIG. 20.

Figure 21:
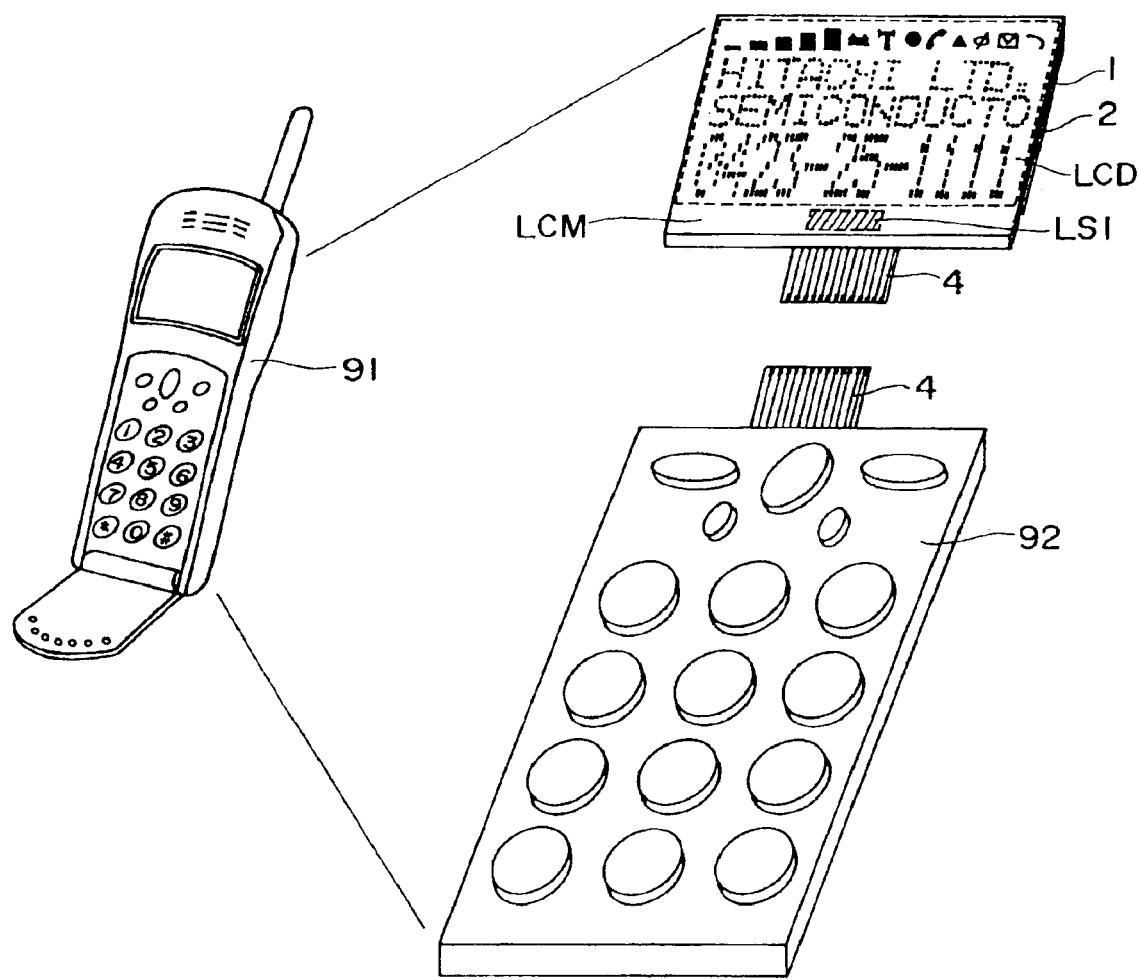
FIG. 21 is a schematic view illustrating a portable telephone that incorporates the liquid crystal display module (LCM) embodying the invention.

FIG. 21 is a schematic view illustrating a portable telephone that incorporates the liquid crystal display module (LCM) embodying the invention. This module is connected via the heat seal 4 to a printed circuit board 92 that carries a CPU, and the assembly is installed in the portable telephone 91.

In the inventive liquid crystal display module (LCM), as described, the terminals IM and ID0 are connected to the second connecting region 24, and the terminal ID1/CS* is connected to the power supply dummy terminal VCC-DUMMY2 via the pad-to-pad connection wiring 25. These connections eliminate the need for drawing the terminals IM, ID0 and ID1/C* up to an edge of the glass substrate 1 by use of input/output wires 22 for connection to the heat seal 4 at the edge. This translates into a reduced number of input/output wires 22 furnished on the glass substrate 1.

As a result, the wiring patterns of the input/output wires formed by the transparent conductive film (ITO) on the glass substrate 1 are appreciably simplified. That is, the power supply potential wires and reference power supply wires do not cross ordinary signal conductors over the glass substrate 1. This in turn simplifies the wiring patterns of the input/output wires 22. Less complicated wiring steps make it possible to fabricate the liquid crystal display module (LCM) more simply and at lower cost than before.

In addition, the heat seal 4 has a reduced area. The narrowed seal area translates into a reduced fabrication cost of the heat seal 4.

Furthermore, there is a reduced need for practicing complicated rerouting of wires inside the printed circuit board connected to the liquid crystal display module (LCM). This makes it possible to reduce the area of the printed circuit board and to lower the cost of its fabrication.

In the inventive liquid crystal display module (LCM), the power supply wires feeding supply voltages to the LCD controller (LSI) can be drawn not only from the middle of the LCD controller but also from the latter's edge (upper or lower edge) for connection to the heat seal 4. This allows the liquid crystal display module (LCM) to lay out its power supply wires to match the power supply wiring arrangements on a printed circuit board incorporated in a portable apparatus. The module can thus deal with diverse kinds of printed circuit boards used in portable equipment.

Given the characteristics outlined above, the liquid crystal display module (LCM) of the invention contributes to enhancing degrees of freedom in arranging power supply wiring patterns. When incorporated in the portable telephone, the inventive module helps downsize the telephone set and lower the fabrication cost of the latter.

Figure 22:
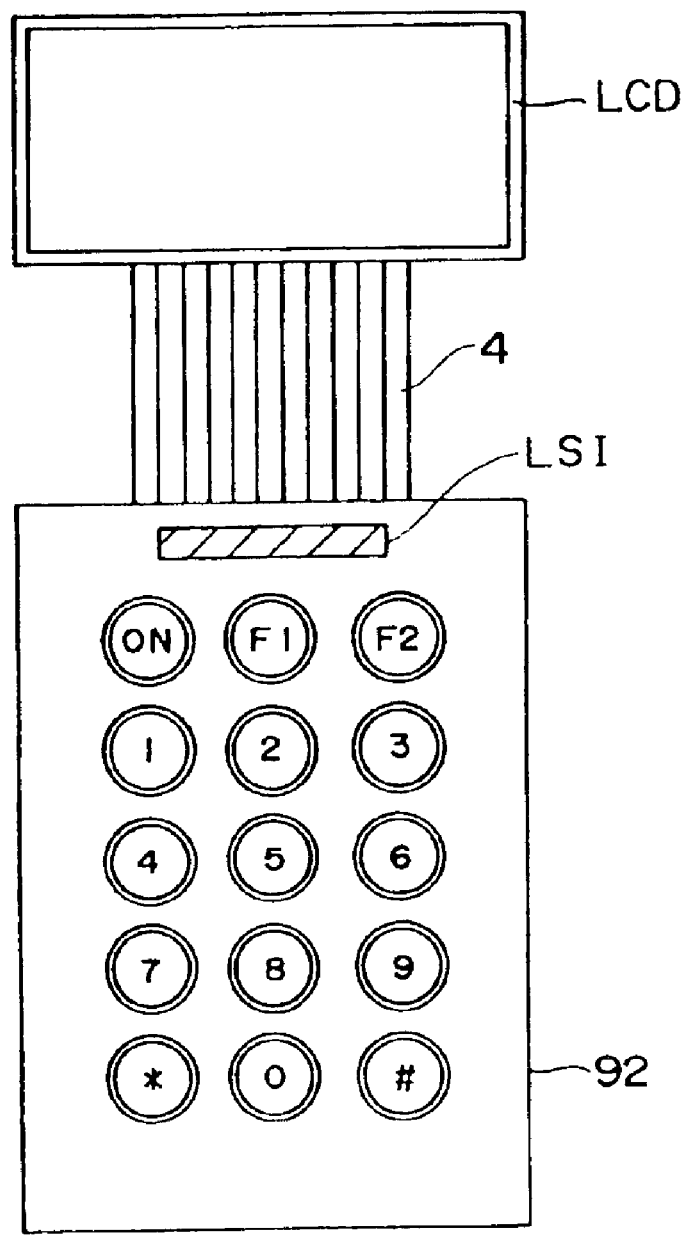
FIG. 22 is a schematic view showing a chip-on-board (COB) type liquid crystal display module (LCM) embodying the invention.
Figure 23:
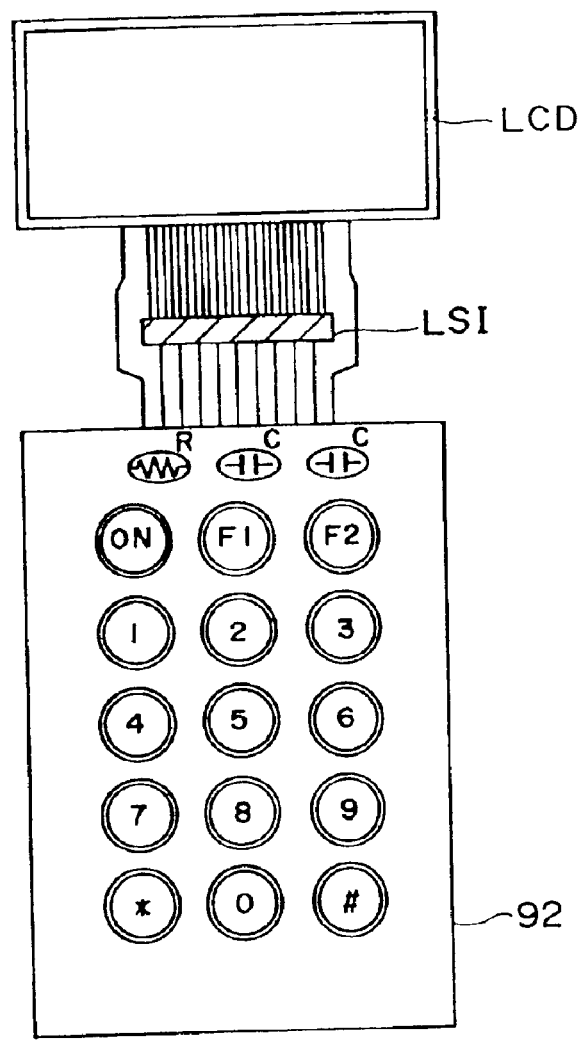
FIG. 23 is a schematic view depicting a tape-carrier-package (TCP) type liquid crystal display module (LCM) embodying the invention.

Although the invention has been described primarily in the applied form of a chip-on-glass type liquid crystal display module, this is not limitative of the invention. Alternatively, the invention may also be applied to a liquid crystal display device wherein an LCD controller and a liquid crystal display panel (LCD) are connected in a chip-on-board (COB) arrangement as shown in FIG. 22, or connected in a tape-carrier-package (TCP) arrangement as depicted in FIG. 23.

As another alternative, the glass substrates 1 and 2 constituting the liquid crystal display panel (LCD) may be replaced by polymer films.

Figure 24:
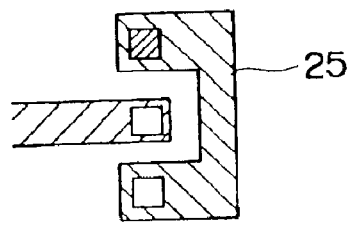
FIG. 24 is a schematic view showing a structure of pad-to-pad connection wiring 25 included in the embodiment.

It is not mandatory to locate the power supply dummy terminals VCCDUMMY1 and VCCDUMMY2 next to the mode terminals 41. If the pad-to-pad connection wiring 25 has a wiring pattern shown in FIG. 24, the two dummy terminals may be located away from the mode terminals 41. It is also possible to connect the power supply dummy terminals VCCDUMMY1 and VCCDUMMY2 to the power supply wires of a reference potential $V_{GND}$ inside the LCD controller (LSI) so that the reference potential $V_{GND}$ is fed to the mode terminals 41 via the pad-to-pad connection wiring 25.

This invention, when embodied in the manner described above, offers the following major benefits:

The liquid crystal display device according to the invention has a reduced number-of input/output wires connected to the input/output terminals of the semiconductor integrated circuit for driving the LCD panel. The wiring patterns of the input/output wires is simplified, and degrees of freedom in arranging such input/output wiring patterns are improved. This translates into a smaller size and a lower fabrication cost of the liquid crystal display device than before.

The printed circuit board connected to the liquid crystal display device is simplified in structure, the number of parts on the board is reduced, and the sizes of such parts are diminished. These improvements make it possible to lower the cost of fabricating the printed circuit board.

Because there is less rerouting of signal conductors inside the printed circuit board connected to the liquid crystal display device, it is possible to reduce the area of the board. The reduced area translates into a reduced fabrication cost of the board.

When the inventive liquid crystal display device is used on portable equipment such as the portable telephone, the equipment can be reduced in size. The diminished dimensions contribute to lowering the cost of fabricating such portable equipment.

Although the description above contains many specificities, these should not be construed as limiting the scope of the invention but as merely providing illustrations of the presently preferred embodiments of this invention. For example, the invention may be applied to any small-sized communication devices such as telephone sets and other electronic devices in addition to the liquid crystal display device for use with the portable telephone as described above. Thus the scope of the invention should be determined by the appended claims and their legal equivalents, rather than by the examples given.

What is claimed is:

1. A liquid crystal display device comprising:
   a first substrate;
   a liquid crystal display panel formed on one surface of said first substrate, said liquid crystal display panel including a second substrate over said one surface of said first substrate and a liquid crystal layer between said first and second substrates;
   a semiconductor chip for controlling said liquid crystal display panel, disposed on said first substrate, said semiconductor chip including a wafer substrate on which is formed an integrated circuit, a plurality of external terminals and a first conductive layer, said first conductive layer being not electrically connected in said semiconductor chip to said integrated circuit, said plurality of external terminals including a plurality of signal terminals, a plurality of first fixed potential terminals, a plurality of second fixed potential terminals, and terminals which are electrically connected to said first conductive layer at respective end portions thereof and which are exposed from one surface of said semiconductor chip; and
   a plurality of second conductive layers formed on said one surface of said first substrate, said plurality of second conductive layers electrically connecting between said plurality of external terminals of said semiconductor chip and an external device,
   wherein said semiconductor chip is mounted on said first substrate such that said one surface of said semiconductor chip is faced to said one surface of said first substrate and said plurality of external terminals of said semiconductor chip are electrically connected to the corresponding second conductive layers via bump electrodes;
   wherein first ones of said first fixed potential terminals are electrically connected to one of said terminals which is connected to said first conductive layer, by a first one of said plurality of second conductive layers, and
   wherein second ones of said first fixed potential terminals are electrically connected to the other of said terminals which is connected to said first conductive layer, by a second one of said plurality of second conductive layers, whereby said first and second ones of said first fixed potential terminals are electrically connected to each other through said first conductive layer of said semiconductor chip.

2. A liquid crystal display device according to claim 1, wherein said second fixed potential terminals includes first ones and second ones which are spaced from each other in a plan view;

wherein said first and second ones of said second fixed potential terminals are electrically connected to each other by a third one of said plurality of second conductive layers, and wherein said third one of said plurality of second conductive layers crosses said first conductive layer of said semiconductor chip in said plan view.

3. A liquid crystal display device according to claim 2, wherein said plurality of second conductive layers are formed of an optically transparent conductive film.

4. A liquid crystal display device according to claim 3, wherein said first conductive layer is formed of an aluminum film.

5. A liquid crystal display device according to claim 4, further comprising flexible tape wirings attached to said one surface of said first substrate, wherein said flexible tape wirings are electrically connected to corresponding ends of said plurality of second conductive layers.

6. A liquid crystal display device according to claim 5, wherein said optically transparent conductive film includes indium-tin-oxide.

7. A liquid crystal display device according to claim 1, wherein said plurality of external terminals further include a plurality of output signal terminals for driving said liquid crystal display panel, and wherein said plurality of output signal terminals and said liquid crystal display panel are electrically connected to each other by said plurality of second conductive layers.

* * * * *